US009473139B2

(12) United States Patent
Vrudhula et al.

(10) Patent No.: US 9,473,139 B2
(45) Date of Patent: Oct. 18, 2016

(54) THRESHOLD LOGIC ELEMENT WITH STABILIZING FEEDBACK

(71) Applicants: Sarma Vrudhula, Chandler, AZ (US); Niranjan Kulkarni, Phoenix, AZ (US)

(72) Inventors: Sarma Vrudhula, Chandler, AZ (US); Niranjan Kulkarni, Phoenix, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 14/792,183

(22) Filed: Jul. 6, 2015

(65) Prior Publication Data

US 2016/0006438 A1    Jan. 7, 2016

Related U.S. Application Data

(60) Provisional application No. 62/020,504, filed on Jul. 3, 2014, provisional application No. 62/163,928, filed on May 19, 2015.

(51) Int. Cl.
*H03K 19/094* (2006.01)
*G11C 7/00* (2006.01)
(Continued)

(52) U.S. Cl.
CPC ......... *H03K 19/00361* (2013.01); *G11C 7/065* (2013.01); *G11C 11/1673* (2013.01);
(Continued)

(58) Field of Classification Search
CPC . G06F 5/10; G06F 2207/4818; H03K 19/20; H03K 17/165; H03K 19/0185; H03K 19/0813; H03K 19/00315; H03K 19/0963; H03K 19/215; H03K 19/0948; H03K 19/09432; H03K 19/09436; H03K 19/0944; H03K 19/018521; H03K 19/018571; H03K 19/0843; H03K 19/013; H03K 19/082; H03K 19/086; H03K 19/0863; H03K 19/018507; H03K 19/018514; H03K 19/018528; H03K 19/018542; H03K 19/018578; H03K 2005/00065; H03K 2005/00182; H03K 5/2409; H03K 5/2436; H03K 5/2472; H03K 5/2418; H03K 5/2445; H03K 5/2481; H04N 1/00769; G11C 2207/063; G11C 2207/065; G11C 7/06; G11C 7/062; G11C 7/065; G11C 7/067; H01L 27/1104; H01L 29/49; H01L 29/783; H01L 2924/13091; H01L 21/8238; H01L 27/0922; H01L 27/11807
See application file for complete search history.

(56) References Cited

U.S. PATENT DOCUMENTS 3,715,603 A * 2/1973 Lerch ................. H03K 19/0948
326/121
3,720,821 A * 3/1973 Heightley ............... G06F 7/501
326/35
(Continued)

FOREIGN PATENT DOCUMENTS

WO    2015006342 A1    1/2015

OTHER PUBLICATIONS

Avedillo, M.J., et al., "Low-power CMOS threshold-logic gate," Electronics Letters, vol. 31, Issue 25, Dec. 7, 1995, IEEE, pp. 2157-2159.
(Continued)

*Primary Examiner* — Vibol Tan
(74) *Attorney, Agent, or Firm* — Withrow & Terranova, P.L.L.C.

(57) ABSTRACT

Threshold logic elements and methods of operating the same are disclosed. In one embodiment, a threshold logic element includes a first input gate network configured to receive a first set of logical signals, a second input gate network configured to receive a second set of logical signals. The differential sense amplifier is operably associated with the first input gate network and the second input gate network such that the differential sense amplifier is configured to generate a differential logical output in accordance with a threshold logic function. In order to make the threshold logic element more robust, the differential sense amplifier is configured to feed back the differential logical output to the first input gate network and the second input gate network. By providing the differential logical output as feedback, floating node issues are avoided and the threshold logic element is more resistant to noise.

18 Claims, 5 Drawing Sheets

(51) Int. Cl.
  H03K 19/003 (2006.01)
  G11C 7/06 (2006.01)
  G11C 11/16 (2006.01)
  G11C 13/00 (2006.01)
  H03K 19/00 (2006.01)
  H03K 19/017 (2006.01)
  H03K 19/096 (2006.01)
  H03K 19/21 (2006.01)
(52) U.S. Cl.
  CPC ......... G11C13/004 (2013.01); H03K 19/0027 (2013.01); H03K 19/01707 (2013.01); H03K 19/0963 (2013.01); H03K 19/215 (2013.01)

(56) References Cited

U.S. PATENT DOCUMENTS

| | | | |
|---|---|---|---|
| 3,898,616 A * | 8/1975 | Baugh | H03K 19/0813 327/18 |
| 5,153,853 A * | 10/1992 | Eby | G11C 14/00 365/185.08 |
| 5,859,548 A | 1/1999 | Kong | |
| 5,991,789 A | 11/1999 | Prange et al. | |
| 6,002,270 A | 12/1999 | Timoc | |
| 6,028,453 A | 2/2000 | Kong | |
| 6,046,608 A | 4/2000 | Theogarajan | |
| 6,278,298 B1 | 8/2001 | Hayakawa | |
| 6,381,181 B1 | 4/2002 | Nguyen | |
| 6,392,467 B1 | 5/2002 | Oowaki et al. | |
| 6,420,905 B1 | 7/2002 | Davis et al. | |
| 6,424,181 B1 | 7/2002 | Pogrebnoy | |
| 6,437,604 B1 | 8/2002 | Forbes | |
| 6,580,296 B1 | 6/2003 | Beiu | |
| 6,838,909 B2 * | 1/2005 | Huang | H03K 19/01707 326/121 |
| 7,417,468 B2 | 8/2008 | Verbauwhede et al. | |
| 8,164,359 B2 | 4/2012 | Leshner et al. | |
| 8,181,133 B2 | 5/2012 | Gowda et al. | |
| 8,601,417 B2 | 12/2013 | Gowda et al. | |
| 8,832,614 B2 | 9/2014 | Vrudhula et al. | |
| 2006/0119406 A1 | 6/2006 | Henzler et al. | |
| 2013/0313623 A1* | 11/2013 | Vrudhula | H01L 43/02 257/295 |
| 2013/0339914 A1* | 12/2013 | Vrudhula | G06F 17/505 716/104 |

OTHER PUBLICATIONS

Beiu, Valeriu, et al., "VLSI Implementations of Threshold Logic—A Comprehensive Survey," IEEE Transactions on Neural Networks, vol. 14, Issue 5, Sep. 2003, IEEE, pp. 1217-1243.

Hidalgo-Lopez, J.A., et al., "New Types of Digital Comparators," Presented at the International Symposium on Circuits and Systems, vol. 1, Apr. 30-May 3, 1995, Seattle, Washington, IEEE, pp. 29-32.

Leshner, Samuel, et al., "A low power, high performance logic-based standard cell multiplier in 65 nm CMOS," Presented at the IEEE Annual Symposium on VLSI, Jul. 5-7, 2010, Lixouri, Greece, IEEE, pp. 201-215.

Leshner, Samuel, et al., "Design of a robust, high performance standard cell threshold logic family for DSM technology," Presented at the 22nd International Conference on Microelectronics, Dec. 19-22, 2010, Cairo, Egypt, IEEE, pp. 52-55.

Leshner, Samuel, "Modeling and Implementation of Threshold Logic Circuits and Architectures," PhD Thesis, Arizona State University, Tempe, Arizona, Dec. 2010, 204 pages.

Ozdemir, Hakan, et al., "A Capacitive Threshold-Logic Gate," IEEE Journal of Solid-State Circuits, vol. 31, Issue 8, Aug. 1996, IEEE, pp. 1141-1150.

Padure, Marius, et al., "A New Latch-Based Threshold Logic Family," Presented at the International Semiconductor Conference, vol. 2, Oct. 2001, Sinaia, Romania, IEEE, pp. 531-534.

International Search Report and Written Opinion for International Patent Application No. PCT/US2009/034044, mailed Aug. 10, 2009, 11 pages.

International Preliminary Report on Patentability for International Patent Application No. PCT/US2009/034044, mailed Aug. 26, 2010, 7 pages.

* cited by examiner

US 9,473,139 B2

THRESHOLD LOGIC ELEMENT WITH STABILIZING FEEDBACK

RELATED APPLICATIONS

This application claims the benefit of provisional patent application Ser. Nos. 62/020,504 and 62/163,928, filed Jul. 3, 2014 and May 19, 2015, respectively, the disclosures of which are hereby incorporated herein by reference in their entirety.

This invention was made with government funds under 1237856 awarded by the National Science Foundation. The U.S. Government has certain rights in this invention.

FIELD OF THE DISCLOSURE

This disclosure relates to threshold logic elements for integrated circuits (ICs).

BACKGROUND

A threshold logic element is defined as an n-input processing element having an output defined as:

$$f_T(X) = \begin{cases} 1, & \text{if } \Sigma_{i=1}^{n} w_i x_i \geq T \\ 0, & \text{Otherwise} \end{cases} \quad (1)$$

$$f_T(X) = \begin{cases} 1, & \text{if } \Sigma_{i=1}^{n} w_i x_i \leq T \\ 0, & \text{Otherwise} \end{cases} \quad (2)$$

$$f_T(X) = \begin{cases} 1, & \text{if } \Sigma_{i=1}^{n} w_i x_i \geq T \\ 0, & \text{Otherwise} \end{cases} \quad (3)$$

$$f_T(X) = \begin{cases} 1, & \text{if } \Sigma_{i=1}^{n} w_i x_i \leq T \\ 0, & \text{Otherwise} \end{cases} \quad (4)$$

where $X=[x_0, x_1, \ldots, x_{n-1}]$, $W=[w_0, w_1, \ldots, w_{n-1}]$, and T are a set of data inputs that represent Boolean variables, a set of fixed signed integer weights associated with data inputs, and a threshold, respectively. A threshold logic element may be used to implement a threshold logic function as described by one of the equations above, which is equivalent to a complex Boolean function. Threshold logic elements may occupy less room than a Boolean network needed to implement the complex Boolean function. There is a need for a threshold logic gate, or element, that is robust and more resistant to noise.

SUMMARY

Threshold logic elements and methods of operating the same are disclosed. In one embodiment, a threshold logic element includes a first input gate network configured to receive a first set of logical signals and a second input gate network configured to receive a second set of logical signals. A differential sense amplifier is operably associated with the first input gate network and the second input gate network such that the differential sense amplifier is configured to generate a differential logical output in accordance with a threshold logic function. In order to make the threshold logic element more robust, the differential sense amplifier is configured to feed back the differential logical output to the first input gate network and the second input gate network. By providing the differential logical output as feedback, floating node issues are avoided and the threshold logic element is more resistant to noise.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 illustrates one embodiment of a threshold logic element having a first input gate network formed from parallel P-channel field effect transistors (PFETs), a second input gate network formed also from parallel PFETs, and a differential sense amplifier that generates a differential logical output in accordance with a threshold function and provides the differential logical output to the first input gate network and the second input gate network as feedback.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
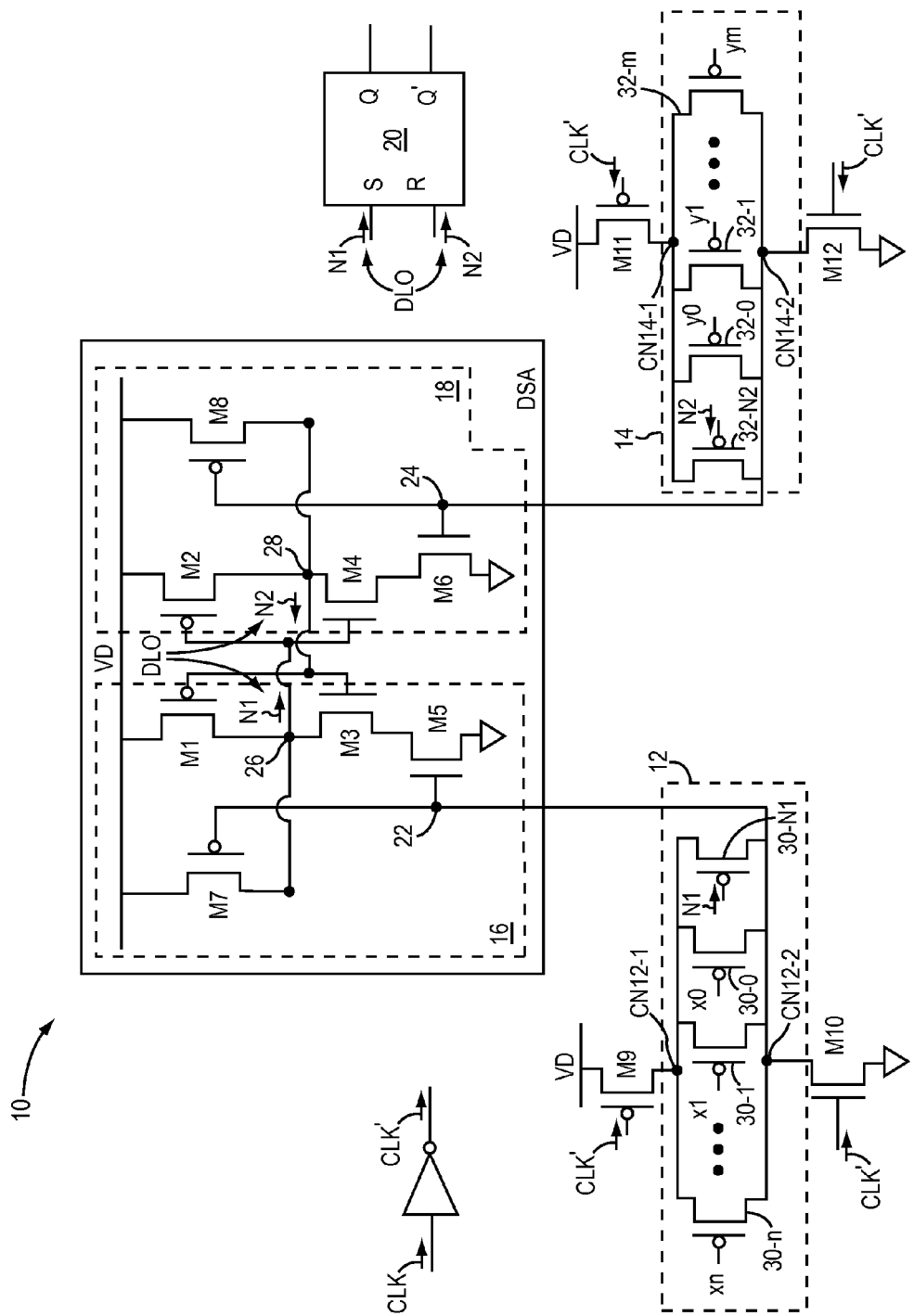

FIG. 1 illustrates an embodiment of a threshold logic element (TLE) 10. In general, the TLE 10 includes a first input gate network 12, a second input gate network 14, and a differential sense amplifier DSA formed by a first amplifier branch 16 and a second amplifier branch 18. The TLE 10 is configured to perform a threshold logic function. In this embodiment, the TLE 10 includes a sequential state element 20 in order to store a result of the threshold logic function stored by the TLE 10. As discussed in further detail below, the first input gate network 12 is formed by a number of parallel transmission gates.

In the embodiment shown in FIG. 1, the transmission gates in the first input gate network 12 are driven by a first set of logical signals. As explained in further detail below, the first set of logical signals includes a first set of logical inputs (referred to generically as elements x and specifically as elements x0 to xn) and a first logical output N1 provided as feedback from the first amplifier branch 16. Likewise, the second input gate network 14 is formed by a number of parallel transmission gates. The transmission gates in the second input gate network 14 are driven by a second set of logical signals. As explained in further detail below, the second set of logical signals includes a second set of logical inputs (referred to generically as elements y and specifically as elements y0 to ym) and a second logical output N2 provided as feedback from the second amplifier branch 18. Accordingly, the differential sense amplifier DSA is configured to feedback a differential logical output DLO generated by the DSA to the first input gate network 12 and the second input gate network 14. By providing the differential logical output DLO as feedback to the first input gate network 12 and the second input gate network 14, the differential logical output DLO is prevented from floating.

As explained in further detail below, the first set of logical inputs may include data inputs and/or threshold inputs. Furthermore, the second set of logical inputs may include data inputs and/or threshold inputs. In this manner, the differential sense amplifier DSA is operably associated with the first input gate network 12 and the second input gate network 14 such that the differential sense amplifier DSA is operable to generate the differential logical output DLO in accordance with the threshold logic function performed by the TLE 10. The threshold logic function may be equivalent to a complex Boolean logic function. However, to perform the Boolean logic function, a large network of Boolean logic gates may be needed. By performing the equivalent threshold logic function with the TLE 10 instead of with the large network of Boolean logic gates, the TLE 10 can provide increased spatial efficiency in an integrated circuit (IC).

The first amplifier branch 16 includes an isolated control node 22 operably associated with the first input gate network 12 and the second amplifier branch 18 includes an isolated control node 24 operably associated with the second input gate network 14. Furthermore, the first amplifier branch 16 includes an output node 26 coupled to the sequential state element 20 while the second amplifier branch 18 includes an output node 28 coupled to the sequential state element 20.

With regards to the first input gate network 12, the first input gate network 12 is driven by the first set of logical signals (i.e., the first set of logical inputs x and the first logical output N1). The first input gate network 12 is configured to drive the isolated control node 22 of the first amplifier branch 16 based on the first set of logical signals. More specifically, the first input gate network 12 is configured to charge the isolated control node 22 based on a number of the transmission gates that are activated by the first set of logical signals, as described in further detail below. As such, the first amplifier branch 16 is configured to generate a logical output N1 of the differential logical output DLO at the output node 26 based on the number of the transmission gates in the first input gate network 12 that are activated by the first set of logical signals With regards to the second input gate network 14, the second input gate network 18 is driven by the second set of logical signals (i.e., the second set of logical inputs y and the second logical output N2). The second input gate network 14 is configured to drive the isolated control node 24 of the second amplifier branch 18 based on the second set of logical signals. More specifically, the second input gate network 18 is configured to charge the isolated control node 24 based on a number of the transmission gates that are activated by the second set of logical signals, as described in further detail below. As such, the second amplifier branch 18 is configured to generate a logical output N2 of the differential logical output DLO at the output node 28 based on the number of the transmission gates in the second input gate network 14 that are activated by the second set of logical signals The differential sense amplifier DSA is configured to generate the differential logical output DLO in accordance with a threshold logic function. In this embodiment, the differential sense amplifier DSA is formed by transistors M1-M8. More specifically, the first amplifier branch 16 is formed by transistors M1, M3, M5, and M7 connected as shown. Likewise, the second amplifier branch 18 is formed by transistors M2, M4, M6, and M8 connected as shown. The sequential state element 20 has a first input terminal S connected to an output node 26 of the first amplifier branch 16 and a second input terminal R connected to an output node 28 of the second amplifier branch 18. Based on the differential logical output DLO at the output nodes 26 and 28, the sequential state element 20 operates to provide a logical output Q and an inverted logical output Q', which is inverted with respect to the logical output Q.

To time the operation of the TLE 10, a transistor M9 and a transistor M10 are each coupled to the first input gate network 12. Both the transistor M9 and the transistor M10 are configured so as to receive an inverted clock signal CLK', which is an inverse of a non-inverted clock signal CLK. Furthermore, a transistor M11 and a transistor M12 are each coupled to the second input gate network 14. The transistor M11 and the transistor M12 are also each configured so as to receive the inverted clock signal CLK'. Each of the transistors M1 through M12 is a field effect transistor (FET), such as a Complementary Metal-Oxide-Semiconductor (CMOS) transistor. However, the present invention is not limited thereto and other types of transistors, such as other types of FETs, may be utilized.

With respect to the first amplifier branch 16, each of the transistors M1, M7 is a P-channel field effect transistor (PFET). Each of the transistors M1, M7 also has a source coupled to receive a supply voltage VD and a drain coupled to the output node 26. A gate of the transistor M1 is coupled to the output node 28 of the second amplifier branch 18 and is thus configured to receive the logical output N2 from the second amplifier branch 18. A gate of the transistor M7 is coupled to the isolated control node 22. Thus, the transistors M1, M7 are each configured to drive the output node 26 near a DC voltage level of the supply voltage VD when activated. As such, the transistors M1, M7 drive the logical output N1 at the output node 26 to a logical "1" when activated, as explained in further detail below. Each of the transistors M3, M5 is a N-channel field effect transistor (NFET). A drain of the transistor M3 is coupled to the output node 26, and a source of the transistor M3 is coupled to a drain of the transistor M5. A source of the transistor M5 is coupled to ground. Accordingly, the transistor M3 and the transistor M5 form a discharge path between the output node 26 and ground. When either or both of the transistor M3 or the transistor M5 is deactivated, the discharge path is opened. However, when both the transistors M3,M5 are activated the discharge path is closed. As such, the output node 26 is discharged and pulled near ground. Accordingly, the transistors M3, M5 drive the logical output N1 to a logical "0" when activated.

In this embodiment, the gate of the transistor M3 is coupled to the output node 28 of the second amplifier branch 18 and is thus also configured to receive the logical output N2 from the second amplifier branch 18. A gate of the transistor M5 is coupled to the isolated control node 22. In this manner, the first amplifier branch 16 forms a first NAND gate, where the isolated control node 22 can be considered an input node and the gate of the transistor M1 can be considered as another input node. The output node 26 provides the output node of the first NAND gate.

With regard to the transistor M9 coupled to the first input gate network 12, the transistor M9 is a PFET. A source of the transistor M9 receives the supply voltage VD. A drain of the transistor M9 is coupled to a common node CN12-1 of the first input gate network 12. A gate of the transistor M9 is coupled to receive the inverted clock signal CLK'.

With regard to the transistor M10 coupled to the first input gate network 12, the transistor M10 is an NFET. A drain of the transistor M10 is coupled to a common node CN12-2 of the first input gate network 12. The common node CN12-2 is coupled to the isolated control node 22 of the first amplifier branch 16 and thus also to the gate of the transistor M5 and the gate of the transistor M7. A source of the transistor M10 is coupled to ground. A gate of the transistor M10 is coupled to receive the inverted clock signal CLK'.

With respect to the second amplifier branch 18, each of the transistors M2, M8 is a PFET. Each of the transistors M2, M8 also has a source coupled to receive the supply voltage VD and a drain coupled to the output node 28. A gate of the transistor M2 is coupled to the output node 26 of the first amplifier branch 16 and is thus configured to receive the first logical output N1 from the first amplifier branch 16. A gate of the transistor M8 is coupled to the isolated control node 24. Thus, the transistors M2, M8 are each configured to drive the output node 28 near the DC voltage level of the supply voltage VD when activated. As such, the transistors M2, M8 drive the logical output N2 at the output node 28 to a logical "1" when activated, as explained in further detail below. Each of the transistors M4, M6 is a NFET. A drain of the transistor M4 is coupled to the output node 28 and a source of the transistor M4 is coupled to a drain of the transistor M6. A source of the transistor M6 is coupled to ground. Accordingly, the transistor M4 and the transistor M6 form a discharge path between the output node 28 and ground. When either or both of the transistor M4 or the transistor M6 is deactivated, the discharge path is opened. However, when both the transistors M5, M6 are activated the discharge path is closed. As such, the output node 28 is discharged and pulled near ground. Accordingly, the transistors M3, M5 drive the logical output N2 to a logical "0" when activated.

The gate of the transistor M4 is coupled to the output node 26 of the first amplifier branch 16 and is thus also configured to receive the logical output N1 from the first amplifier branch 16. The gate of the transistor M6 is coupled to the isolated control node 24. In this manner, the second amplifier branch 18 forms a second NAND gate, where the isolated control node 24 can be considered an input node, and the gate of the transistor M2 can be considered as another input node. The output node 28 provides the output node of the second NAND gate. As such, the first NAND gate (i.e., in this embodiment, the first amplifier branch 16) and the second NAND gate (i.e., in this embodiment, the second amplifier branch 18) that form the differential sense amplifier DSA are cross-coupled NAND gates.

With regard to the transistor M11 coupled to the second input gate network 14, the transistor M11 is a PFET. A source of the transistor M11 receives the supply voltage VD. A drain of the transistor M11 is coupled to a common node CN14-1 of the second input gate network 14. A gate of the transistor M11 is coupled to receive the inverted clock signal CLK'.

With regard to the transistor M12 coupled to the second input gate network 14, the transistor M12 is an NFET. A drain of the transistor M12 is coupled to a common node CN14-2 of the second input gate network 14. The common node CN14-2 is coupled to the isolated control node 24 of the second amplifier branch 18 and thus also to the gate of the transistor M6 and the gate of the transistor M8. A source of the transistor M12 is coupled to ground. A gate of the transistor M12 is coupled to receive the inverted clock signal CLK'.

During a normal operating mode, the TLE 10 of FIG. 1 operable in a reset state and an evaluation state. The TLE 10 cycles through the reset state and the evaluation state during the normal operating mode in accordance with the non-inverted clock signal CLK and the inverted clock signal CLK'. More specifically, in order to enter the reset state, the non-inverted clock signal CLK is set to a voltage level corresponding to a logic "0," and therefore the inverted clock signal CLK' is set to a voltage level corresponding to a logic "1." As a result, the transistor M10 and the transistor M12 are both activated, and the transistor M9 and the transistor M11 are both deactivated. Therefore, the isolated control node 22 is discharged through transistor M10, and the isolated control node 24 is discharged through the transistor M12. Accordingly, the isolated control node 22 and the isolated control node 24 are each pulled near ground and provided at logic "0." Also, since the transistor M10 and the transistor M12 are both activated, and the transistor M9 and the transistor M11 are both deactivated, the transmission gates in the first input gate network 12 and the transmission gates 14 are deactivated during the reset state.

When the isolated control node 22 and the isolated control node 24 of the first amplifier branch 16 and the second amplifier branch 18, respectively are pulled to logic "0," the transistors M7 and M8 are activated, and the transistors M5 and M6 are deactivated. The discharge path formed by the transistors M3,M5 in the first amplifier branch 16 and the discharge path formed by the transistors M4, M6 in the second amplifier branch 18 are thus both open. The output nodes 26, 28 are prevented from being discharged in the reset state. Furthermore, the transistors M7 is configured to pull the output node 26 of the first amplifier branch 16 near the DC supply voltage level of the supply voltage VD in response to the isolated control node 22 being near ground and at a logic "0." Accordingly, the first logical output N1 is provided at a logic "1" since the output node 26 is charged to a high voltage state (i.e., near a DC voltage magnitude of the supply voltage VD) during the reset state. Likewise, and the transistor M8 is configured to pull the output node 28 of the second amplifier branch 18 near the DC supply voltage level of the supply voltage VD in response to the isolated control node 24 being near ground and at a logic "0.", Thus, the second logical output N2 is also provided at logic "1" since the output node 28 is charged to a high voltage state (i.e., near a DC voltage magnitude of the supply voltage VD) during the reset state. The differential logical output DLO is thus set to a precharge state of "1/1" during the reset state of the TLE. Once the reset state is complete, the transistors M1, M2, M3, M4, M5, and M6 are deactivated, and the remaining transistors, M7, and M8 are activated. At this point, the TLE 10 is primed for evaluation.

On the rising edge of the non-inverted clock signal CLK and falling edge of the inverted clock signal CLK', the TLE 10 transitions to the evaluation state. The TLE 10 is maintained in the evaluation state while the non-inverted clock signal CLK is a logic "1" and the inverted clock signal CLK' is a logic "0." The differential sense amplifier DSA is configured to set one of the logical outputs N1, N2 to a logic "0" and maintain the other one of the logical outputs N2, N1 at a logic "1" during the evaluation state. More specifically, the differential sense amplifier DSA is configured to discharge one of the output nodes 26, 28 to a low voltage state (i.e. logic "0") and prevent the discharge of the other one of the output nodes 28, 26 so as to maintain the other one of the output nodes in the high voltage state (logic "1") during the evaluation state. The differential logic output DLO is thus provided in either a first differential logical state (e.g., "1/0") or in a second differential logical state (e.g., "0/1") opposite the second differential logical state during the evaluation state. This may result in a transition in logical output Q and logical output Q' of the sequential state element 20.

More specifically, as the non-inverted clock signal CLK rises and the inverted clock signal CLK' falls; a current race begins between the first amplifier branch 16 and the second amplifier branch 18. During the evaluation state, the transistor M10 and the transistor M12 are both deactivated, and the transistor M9 and the transistor M11 are both activated. The transistor M10 and the transistor M12 therefore prevent the isolated control node 22 and the isolated control node 24 from being discharged through the transistor M10 and the transistor M12, respectively. Furthermore, the transistor M9 and the transistor M10 pull the common node CN12-1 and the common node CN14-1 near the DC supply voltage level of the supply voltage VD. Accordingly, the transmission gates in the first input gate network 12 are operable to be activated based on the first set of logical signals and the transmission gates in the second input gate network 14 are operable to be activated based on the set of logical signals during the evaluation state.

The differential sense amplifier DSA is operably associated with the first input gate network 12 and the second input gate network 14 such that the first amplifier branch 16 wins the current race when a number of the transmission gates that are activated in the first input gate network 12 is greater than a number of the transmission gates that are activated in the second input gate network 14. In this case, a conductance of the first input gate network 12 is greater than a conductance of the second input gate network 14. Furthermore, the differential sense amplifier DSA is operably associated with the first input gate network 12 and the second input gate network 14 such that the second amplifier branch 18 wins the current race when the number of the transmission gates that are activated in the second input gate network 14 is greater than the number of the transmission gates that are activated in the first input gate network 12. In this case, the conductance of the second input gate network 14 is greater than a conductance of the first input gate network 12.

More specifically, the first amplifier branch 16 wins the current race if the first input gate network 12 charges the isolated control node 22 of the first amplifier branch 16 to a voltage level sufficient (i.e. a logic "1") to activate the transistor M5 and deactivate the transistor M7 before the second input gate network 14 charges the isolated control node 24 of the second amplifier branch to a voltage level (i.e. a logic "1") sufficient to activate the transistor M6 and deactivate the transistor M8. Note that the gate of the transistor M3 is coupled to the output node 28 so as to receive the logical output N2 as feedback from the second amplifier branch 18. Additionally, the gate of the transistor M4 is coupled to the output node 26 so as to receive the logical output N1 as feedback from the first amplifier branch 16 Since both the logical outputs N1, N2 where set to logic "1" during the reset state, the gates of both the transistors M3, M4 initially receive a logic "1" at the beginning of the evaluation state. Furthermore, the gate of the transistor M7 is coupled to the isolated control node 22 and the gate of the transistor M8 is coupled to the isolated control node 24. Accordingly, the isolated control node 22, 24 that is provided at logic "1" fastest will result in either the transistor M7 or the transistor M8 being deactivated and either the transistors M3, M5 or the transistors M4, M6 being activated. If the transistors M3, M5 are activated, the discharge path formed by the transistors M3, M5 is closed and the output node 26 is discharged. Accordingly, the logical output N1 is provided at logic "0." In response, the transistor M2 is activated to maintain the output node 28 and the logical output N2 at logic "1." If the transistors M4, M6 are activated, the discharge path formed by the transistors M4, M6 is closed and the output node 28 is discharged. Accordingly, the logical output N2 is provided at logic "0." In response, the transistor M1 is activated to maintain the output node 26 and the logical output N1 at logic "1."

In this manner, the differential sense amplifier DSA is configured to perform the threshold logic function based on the first set of logical inputs x and the second set of logical inputs y. More specifically, the first amplifier branch 16 wins the current race if the number of transmission gates in the first input gate network 12 activated by the first set of logical inputs x is larger than the number of transmission gates in the second input gate network 14 activated by the second set of inputs y. In this case, due to a conductance of the first input gate network 12 being higher than a conductance of the second input gate network 14, the isolated control node 22 starts to charge before the isolated control node 24. Accordingly, the isolated control node 22 activates the transistor M5 and deactivates the transistor M7. As a result, the output node 26 starts to discharge through the transistor M3 and the transistor M5. The first logical output N1 is thus set to a logical "0" during the evaluation state of the TLE 10. The delay in the start time for charging the output node 28 causes the first logical output N1 to activate the transistor M2. Thus, even if the output node 28 starts to discharge, the discharge of the output node 28 is impeded by the transistor M2 (which is activated) thereby resulting in the output node 28 getting quickly pulled back to the high voltage state. Thus, the second logical output N2 is maintained at logical "1." Accordingly, the differential logical output DLO is provided to have a differential logical state of "0/1," during the evaluation state when a number of the transmission gates 30 are active in the first input gate network 12 is greater than a number of the transmission gates 32 active in the second input gate network 14 during the evaluation state.

Likewise, the second amplifier branch 18 wins the current race if the second input gate network 14 charges the output node 28 of the second input gate network 14 to a voltage level sufficient to activate the transistor M6 and deactivate the transistor M8 before the first input gate network 12 charges the output node 26 of the first input gate network 12 to a voltage level sufficient to activate the transistor M5 and deactivate the transistor M7. In one embodiment, the second input gate network 14 wins the current race if the number of transmission gates in the second input gate network 14 activated by the second set of logical inputs y is larger than the number of transmission gates in the first input gate network 12 activated by the first set of logical inputs x. Due to a conductance of the second input gate network 14 being higher than a conductance of the first input gate network 12, the isolated control node 24 starts to charge before the isolated control node 22. Accordingly, the isolated control node 24 activates the transistor M6 and deactivates the transistor M8. As a result, the output node 28 starts to discharge through the transistor M4 and the transistor M6. The first logical output N1 is thus set to a logical "0" during the evaluation state of the TLE 10. The delay in the start time for charging the output node 26 causes the second logical output N2 to activate the transistor M1. Thus, even if the output node 26 starts to discharge, the discharge of the output node 26 is impeded by the transistor M1 (which is activated) thereby resulting in the output node 26 getting quickly pulled back to the high voltage state and the first logical output N1 being maintained at logical "1." Accordingly, the differential logical output DLO is provided to have a differential logical state of "1/0."

The logical outputs Q and Q' of the sequential state element 20 are adjusted accordingly by the sequential state element 20. The differential logical output DLO includes a first logical output N1 that is received by the input terminal S of the sequential state element 20. In this embodiment, the sequential state element 20 is an SR latch. The input terminal S is the set terminal of the sequential state element 20, and the first logical signal N1 is received at the input terminal S. The differential logical output DLO includes a second logical output N2 that is received by the input terminal R of the sequential state element 20. The input terminal N2 is the reset terminal of the sequential state element 20, and the second logical output N2 is received at the input terminal R. Note that when the differential logical output is set to the precharge state after the reset state, the sequential state element 20 is configured to hold the logical output Q and the inverted logical output Q'. However, after the evaluation state, the sequential state element 20 is configured to set the logical output Q to logic "1" and the inverted logical output Q' to logic "0" in response to the differential logical output DLO being provided at the differential logical state of "0/1" and to set the logical output Q to logic "0" and the inverted logical output Q' to logic "1" in response to the differential logical output DLO being provided at the differential logical state of "1/0."

Furthermore, note that after evaluation completes, all nodes in the TLE 10 have a closed path to either the supply voltage VD or ground. Because of this, the output nodes 26, 28 are latched, and no change in the active number of transmission gates in either of the first input gate network 12 and the second input gate network 14 will have any effect on the logical states stored at the output nodes 26, 28 until the beginning of the next evaluation.

Additionally, note that whether the first input gate network 12 or the second input gate network 14 wins the current race may depend on the number of active transmission gates, as discussed above. However, transistor size or gate widths for the gates forming the first input gate network 12 and the second input gate network 14 may vary in order to allow weighting of the first set of inputs and the second set of inputs. Thus, in this case, the current race may depend on the number of active transmission gates and the sizes or widths of those active gates. Also note that weighting may be performed by allocation of one or more gates per input or, in other words, by providing a single input to multiple gates. Alternatively, each of the transmission gates in the first input gate network 12 and the second input gate network 14 may be the same. More than one of the first set of logical inputs and/or the second set of logical inputs may represent the same Boolean variable so that the Boolean variable is given a weight greater than one.

Referring again to FIG. 1, FIG. 1 illustrates first embodiments of the first input gate network 12 and the second input gate network 14. In this embodiment, the first input gate network 12 and the second input gate network 14 are implemented as transmission gate networks. In the illustrated embodiment, the first input gate network 12 is formed by a number of transmission gates 30-0 through 30-$n$ and 30-N1 (referred to generically as elements "30") connected in parallel branches of the first input gate network 12. In this embodiment, each of the transmission gates 30 is a PFET (such as a PMOS) and has a source coupled to the common node CN12-1 and thus the drain of the transistor M9. Each of the transmission gates 30 also has a drain coupled to the common node CN12-2 and thus the drain of the transistor M10. In this embodiment, the transistor M9 is configured to be deactivated by inverted clock signal CLK', and the transistor M10 is configured to be activated by the inverted clock signal CLK' during the reset state of the TLE 10. The transistors M9 and M10 thus deactivate the transmission gates 30 when the inverted clock signal CLK' is low and thus activate the transmission gates 30 when the inverted clock signal CLK' is high. Furthermore, the transistor M9 is configured to be activated by inverted clock signal CLK' and the transistor M10 is configured to be deactivated by the inverted clock signal CLK' during the evaluation state of the TLE 10. The transistors M9 and M10 thus allow for the activation of the transmission gates 30 by the first set of logical signals. Thus, by providing the transistors M9 and M10, the inverted clock signal CLK' is fed to the first input gate network 12 without (significantly) loading the differential sense amplifier DSA. The arrangement also reduces variability in a clock input capacitance when different numbers of the transmission gates 30 in the first input gate network 12 are activated.

Likewise, the second input gate network 14 is formed by a number of transmission gates 32-0 through 32-$m$ and 32-N2 (referred to generically as elements 32) connected in a parallel branches of the second input gate network 14. In this embodiment, each of the transmission gates 32 is a PFET (such as a PMOS) and has a source coupled to the common node CN14-1 and thus the drain of the transistor M11. Each of the transmission gates 32 also has a drain coupled to the common node CN14-2 and thus the drain of the transistor M12. In this embodiment, the transistor M11 is configured to be deactivated by inverted clock signal CLK', and the transistor M12 is configured to be activated by the inverted clock signal CLK' during the reset state of the TLE 10. The transistors M11 and M12 thus deactivate the transmission gates 32 when the inverted clock signal CLK' is low and thus activate the transmission gates 32 when the inverted clock signal CLK is high. Furthermore, the transistor M11 is configured to be activated by inverted clock signal CLK' and the transistor M12 is configured to be deactivated by the inverted clock signal CLK' during the evaluation state of the TLE 10. The transistors M11 and M12 thus allow for the activation of the transmission gates 32 by the second set of logical signals during the evaluation state. Thus, by providing the transistors M11 and M12, the inverted clock signal CLK' is fed to the second input gate network 14 without (significantly) loading the differential sense amplifier DSA. The arrangement also reduces variability in a clock input capacitance when different numbers of the transmission gates in the second input gate network 14 are activated. Note that the number of gates (n+2) in the first input gate network 12 and the number of gates (m+2) in the second input gate network 14 may or may not be equal depending on the particular implementation of the TLE 10.

As mentioned above, the differential sense amplifier DSA is configured to feed back the differential logical output DLO generated by the differential sense amplifier DSA to the first input gate network 12 and the second input gate network 14. By providing the differential logical output DLO as feedback to the first input gate network 12 and the second input gate network 14, the differential logical output DLO is prevented from floating and thus helps prevent coupling noise from causing errors in the logical outputs N1, N2. This thus helps prevent the logical output Q and the inverted logical output Q' from being provided in an incorrect logical state. Also if a clock period of the non-inverted clock signal CLK and the inverted clock signal CLK' is long enough to result in charge leaks at the isolated control node 22 and the isolated control node 24, feeding back the differential logical output DLO generated by the differential sense amplifier DSA to the first input gate network 12 and the second input gate network 14 helps prevent these charge leaks by driving the isolated control nodes 22, 24 during the clock cycle.

Each of the transmission gates 30 of the first input gate network 12 has a gate that is configured to receive a corresponding one of the first set of logical signals. More specifically, the gate of each of the transmission gates 30-0-30-$n$ is configured to receive a different corresponding one of the first set of logical inputs x0-xn. The transmission gate 30-N1 is configured to receive the first logical output N1 from the output node 26 of the first amplifier branch 16 in the differential sense amplifier DSA. During the evaluation state, the transmission gate 30-N1 is configured to drive the isolated control node 22 in accordance to the first logical output N1 of the first amplifier branch 16. For example, if the first logical output N1 is provided at logical "0" during the evaluation state, the isolated control node 22 is driven by the transmission gate 30-N1 to a logical "1" since the transmission gate 30-N1 is activated by the first logical output N1. This is because the common control node CN12-2 and the isolated control node 22 are driven by the transmission gate 30-N1 near the DC voltage level of the supply voltage VD. As such, the first logical output N1 is also driven by the transmission gate 30-N1 to maintain the logical "0." Furthermore, if the first logical output N1 is provided at logical "1" during the evaluation state, the isolated control node 22 is driven by the transmission gate 30-N1 to a logical "0." As such, the first logical output N1 is also driven by the transmission gate 30-N1 to maintain the logical "1."

Likewise, each of the transmission gates 32 also has a gate that is configured to receive a corresponding one of the second set of logical signals. More specifically, the gate of each of the transmission gates 32-0-30-$m$ is configured to receive a different corresponding one of the second set of logical inputs y0-ym. The transmission gate 32-N2 is configured to receive the second logical output N2 from the output node 28 of the second amplifier branch 18 in the differential sense amplifier DSA. During the evaluation state, the transmission gate 32-N2 is configured to drive the isolated control node 24 in accordance with the second logical output N2 of the second amplifier branch 18. For example, if the second logical output N2 is provided at logical "0" during the evaluation state, the isolated control node 24 is driven by the transmission gate 32-N2 to a logical "1" since the transmission gate 32-N2 is activated by the second logical output N2. This is because the common control node CN14-2 and the isolated control node 24 are driven by the transmission gate 32-N2 near the DC voltage level of the supply voltage VD. As such, the second logical output N2 is also driven by the transmission gate 32-N2 to maintain the logical "0" since the transmission gate 32-N2 is deactivated by the second logical output N2. This is because the common control node CN14-2 and the isolated control node 24 are driven by the transmission gate 32-N2 near the ground. Furthermore, if the second logical output N2 is provided at logical "1" during the evaluation state, the isolated control node 24 is driven by the transmission gate 32-N2 to a logical "0." As such, the second logical output N2 is also driven by the transmission gate 32-N2 to maintain the logical "1."

There are various signal assignment techniques that may be used to implement a threshold logic function with the TLE 10 shown in FIG. 1. Threshold logic functions are a proper subset of unate functions. Without loss of generality, we can assume that they are also positive, i.e., all the weights are positive integers. The TLE 10 can be configured to realize a given positive threshold logic function $f(z0, z1, \ldots, zt)$, where z0-zt (referred to generically as elements z) are each Boolean inputs. The signal assignment techniques are techniques for providing the Boolean inputs z and complements (referred to specifically as elements z0'-zt' or generically as elements z') of the Boolean inputs z to the appropriate transmission gates 30, 32 in the first input gate network 12 and the second input gate network 14. There are many possible ways to do this assignment, and the implementation of the TLE 10 is not restricted to any particular one. However, the specific signal assignment technique described herein is viewed as having an n+1 number of bit inputs. In this example, the number n is also considered to be equal to m so that the number of transmission gates in the first input gate network 12 and the number of transmission gates in the second input gate network 14 are equal. The second set of logical inputs y of the transmission gates 32 in the second input gate network 14 will be driven by bit inputs (which include the Boolean inputs z) while the first set of logical inputs x of the transmission gates 30 of the first input gate network 12 will be driven by complements of the bit inputs (which include the complement Boolean inputs z'). This signal assignment is referred to as complementary signal assignment (CSA).

To ensure that the number of transmission gates 30, 32 activated in the first input gate network 12 and the second input gate network 14 are never equal, n+1 is odd. This is because if the n+1 number were even, and if an r number were active in the first input gate network 12, then n+1-r would be active in the second input gate network 14. Hence if r=n+1, an equal number of transistors would be active in the first input gate network 12 and second input gate network 14. Since the differential sense amplifier DSA shown in FIG. 1 needs an unequal number of transmission gates to implement the threshold logic function, the number of transmission gates in the first input gate network 12 and the number of transmission gates in the second input gate network 14 are each odd and greater than 1. Since the first input gate network 12 and second input gate network 14 are complementary, for the logical outputs N1 to be 0, just over half (or more) of the transmission gates 30 in the first input gate network 12 must be active. Hence with the number of transmission gates in the first input gate network 12 and the number of transmission gates in the second input gate network 14 each being odd, the TLE 10 with this signal assignment (all transmission gates 30 driven by a distinct and corresponding one of the logical inputs x), implements the threshold function defined by:

Equation 1: $x0 + x1 + \ldots + xn \geq (n+2)/2$     (1)

Consider the generic threshold logic function f(z0, z1, ..., zt) defined by w0*z0+w1*z1+ ... +wt*zt>=T that is to be realized by the TLE 10. Clearly if T>(n+2)=2, then the function f cannot be implemented by TLE 10, given the above mentioned assumptions. Hence T>(n+2)/2. Let D=(n+2)/2−T and W=the summation of the weights w0 through wt. In order to see how bit signals can be mapped to the logical inputs x, y of the TLE 10 to realize f(z0; z0; ...; zt), z should be replicated w times for 1<=i<=m in the definition of f.

Equation 2: $x0 \ldots +xj+xd \ldots +xk \ldots +xq \ldots +xl >= T$ (2)

In equation 2, each of the logical inputs x0 through xj is assigned the same Boolean input z0 so as to equal w0*z0, each of the logical inputs xd to xk is assigned the Boolean input z1 to equal w1*z1, ..., and each of the logical inputs xq to xl is assigned to the logical value zt to equal wt*zt.

Given equations 1 and 2, the second condition on the TLE 10 to be able to realize f(z1; z2; ...; zt) is W+D>=n+1, or W−T<=(n)/2, given the TLE 10 where n number of transmission gates 30, 32. As such, equation 2 can be represented as:

Equation 3: $x1 \ldots +xj+xd \ldots +xk \ldots +xq \ldots +xl+D >= (n+2)/2$ (3)

Since the first set of logical inputs x are set to complements, the first set and the second set of the logical inputs x, y are assigned as follows: (1) D number of the logical inputs y are assigned a logical "1" for each of the Boolean inputs z, (2) w number of the logical inputs y are assigned to represent the same Boolean input z, (3) any remaining logical inputs y are assigned to a logical "0", and (4) each of the logical inputs x is assigned to be a CSA of one of the logical inputs y. Thus, the first set of logical inputs x are thus provided to the first input gate network 12 as the complement of the second set of logical inputs y to the second input gate network 14. The sequential state element 20 is configured to perform an SR latching operation in accordance with the differential logical output DLO to generate the logical output Q and the inverted logical output Q'.

Figure 2:
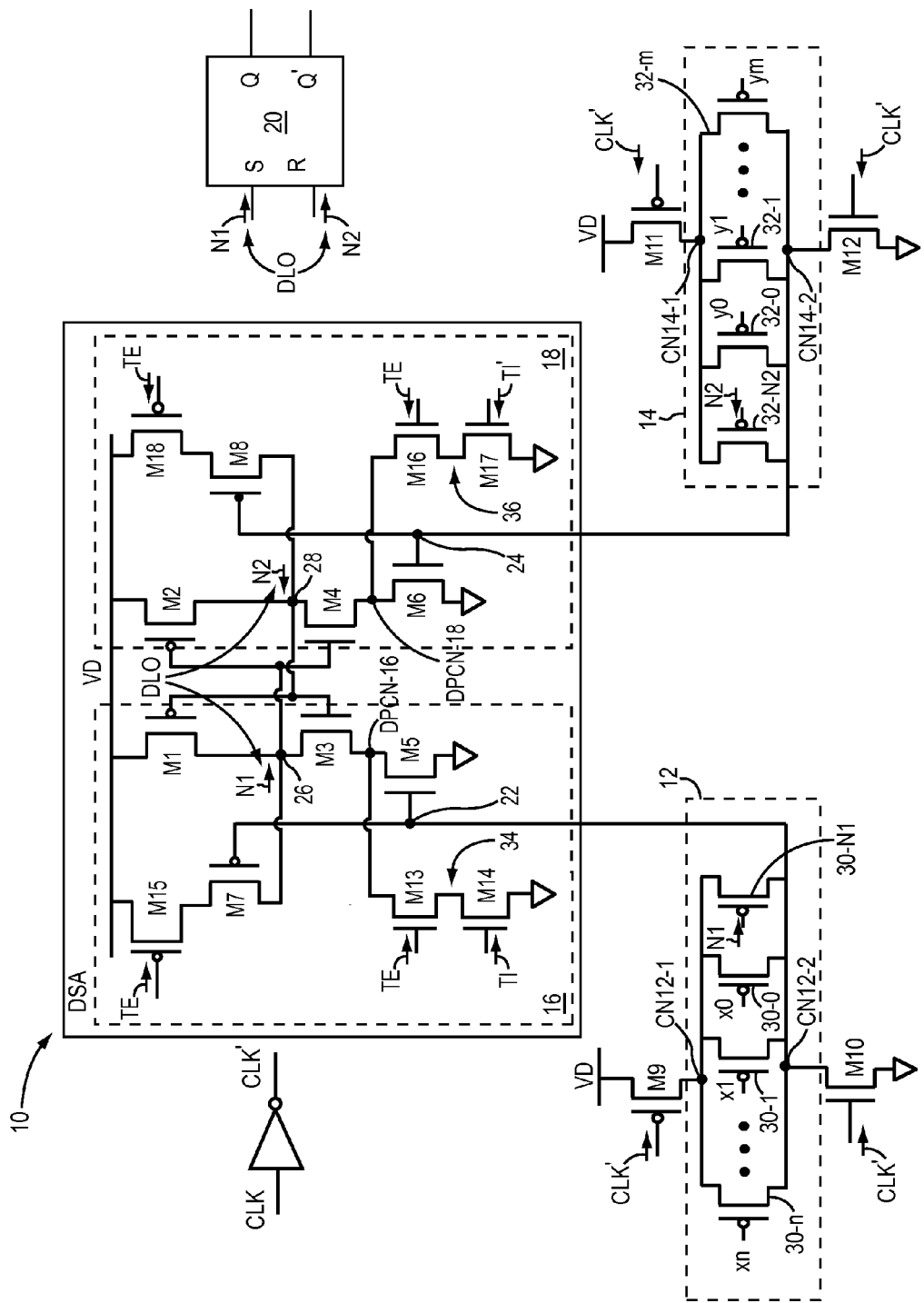
FIG. 2 illustrates another embodiment of the threshold logic element with an embodiment of the differential sense amplifier, which is configured to provide scan mode functionality.

FIG. 2 illustrates another embodiment of the TLE 10. The TLE 10 includes the same embodiments of the first input gate network 12, the second input gate network 14, and the sequential state element 20 described above in FIG. 1. However, the TLE 10 includes another embodiment of the differential sense amplifier DSA. The differential sense amplifier DSA shown in FIG. 2 is similar to the differential sense amplifier DSA shown in FIG. 1. More specifically, the differential sense amplifier DSA shown in FIG. 2 includes another embodiment of the first amplifier branch 16 (i.e., the first NAND gate) having the transistors M1, M3, M5, M7, the isolated control node 22, and the output node 26, which all operate in the same manner described above with respect to FIG. 1 during the reset state and the evaluation state. Furthermore, the differential sense amplifier DSA shown in FIG. 2 includes another embodiment of the second amplifier branch 18 (i.e., the second NAND gate) having the transistors M2, M4, M6, M8, the isolated control node 24, and the output node 28, which all operate in the same manner described above with respect to FIG. 1 during the reset state and the evaluation state. However, in this embodiment, the differential sense amplifier DSA shown in FIG. 2 is configured to provide scan functionality so that the TLE 10 can be tested during a scan mode when provided in an IC.

To provide scan functionality during a scan mode, the first amplifier branch 16 shown in FIG. 2 includes the transistor M13, the transistor M14, and the transistor M15 while the second amplifier branch 18 includes a transistor M16, a transistor M17, and a transistor M18. With respect to the first amplifier branch 16, each of the transistors M13, M14 is a NFET. The transistor M13 and the transistor M14 are stacked to form a discharge path 34 configured to be opened and closed. The discharge path 34 is operably associated with the output node 26 so that the output node 26 is discharged through the discharge path 34 when the discharge path 34 is closed. The discharge path 34 is opened and closed in accordance with a test enable input TE and a test logical input TI in order to operate scan functionality. In this embodiment, a drain of the transistor M13 is coupled to the source of the transistor M3 and the drain of the transistor M5 at a discharge path connection node DPCN-16. A source of the transistor M13 is coupled to a drain of the transistor M14. A gate of the transistor M13 is configured to receive the test enable input TE. Furthermore, a source of the transistor M14 is coupled to ground while a gate of the transistor M14 is configured to receive the test logical input TI. The discharge path 34 therefore provides a shunt path between the discharge path connection node DPCN-16 to ground that is configured to be opened and closed in accordance with the test enable input TE and the test logical input TI.

Furthermore, the first amplifier branch 16 includes the transistor M15, which is a PFET. In this embodiment, the source of the transistor M7 is coupled to a drain of the transistor M15. A source of the transistor M15 is configured to receive the supply voltage VD, while a gate of the transistor M15 is configured to receive the test enable input TE. Thus, the transistor M15 is activated and deactivated in accordance with the test enable input TE. As such, the first amplifier branch 16 is configured to switch between enabling and disabling the first input gate network 12 from charging the isolated control node 22.

With respect to the second amplifier branch 18, each of the transistors M16, M17 is a NFET. The transistor M16 and the transistor M17 are stacked to form a discharge path 36 configured to be opened and closed. The discharge path is operably associated with the output node 28 so that the output node 28 is discharged through the discharge path 36 when the discharge path 36 is closed. The discharge path 36 is opened and closed in accordance with the test enable input TE and an inverted test logical input TI' in order to operate scan functionality. The inverted test logical input TI' is inverted with respect to the test logical input TI. In this embodiment, a drain of the transistor M16 is coupled to the source of the transistor M4 and the drain of the transistor M6 at a discharge path connection node DPCN-18. A source of the transistor M16 is coupled to a drain of the transistor M17. A gate of the transistor M16 is configured to receive the test enable input TE. Furthermore, a source of the transistor M17 is coupled to ground while a gate of the transistor M17 is configured to receive the test logical input TI. The discharge path 36 therefore provides a shunt path between the discharge path connection node DPCN-18 to ground that is configured to be opened and closed in accordance with the test enable input TE and the test logical input TI.

Furthermore, the second amplifier branch 18 includes the transistor M18, which is a PFET. In this embodiment, the source of the transistor M8 is coupled to a drain of the transistor M18. A source of the transistor M18 is configured to receive the supply voltage VD, while a gate of the transistor M18 is configured to receive the test enable input TE. Thus, the transistor M18 is activated and deactivated in accordance with the test enable input TE. As such, the second amplifier branch 18 is configured to switch between enabling and disabling the second input gate network 14 from charging the isolated control node 24.

During a normal operating mode, the test enable input TE and the test logical input TI are each provided at logic "0." Also, during the normal operating mode, the test logical input TI is provided at logic "0," and the inverted test logical input TI' is provided at logic "1." Thus while the TLE 10 shown in FIG. 2 is operating in the normal mode, the TLE 10 shown in FIG. 2 operates in the same manner as the TLE 10 shown in FIG. 1 during both the reset state and the evaluation state in accordance with the non-inverted clock signal CLK and the inverted clock signal CLK'. As such, in the normal operating mode, the discharge path 34 and the discharge path 36 are each open. This is because the transistor M13 and the transistor M16 are each deactivated in response to the test enable input TE being provided at logic "0." Furthermore, the first amplifier branch 16 enables the first input gate network 12 to charge the isolated control node 22, while the second amplifier branch 18 enables the second input gate network 14 to charge the isolated control node 24. This is because the transistor M15 and the transistor M18 are both activated in response to the test enable input TE being provided at logic "0."

Additionally, the first amplifier branch 16 enables the first input gate network 12 to charge the isolated control node 22, while the second amplifier branch 18 enables the second input gate network 14 to charge the isolated control node 24. This is because the transistor M15 and the transistor M18 are both activated in response to the test enable input TE being provided at logic "0." Furthermore, since the transistor M15 is activated, the first amplifier branch 16 enables the transmission gate 30-N1 to drive the isolated control node 22 in accordance with the first logical output N1 of the first amplifier branch 16. Since the transistor M18 is activated, the second amplifier branch 18 enables the transmission gate 32-N2 is to drive the isolated control node 24 in accordance with the second logical output N2 of the second amplifier branch 18.

During the scan mode, the differential sense amplifier DSA is configured to close one of the discharge paths 34, 36 and maintain the other one of the discharge paths 36, 34 open based on the test logical input TI. As such, in the scan mode and while the test enable input TE is provided at logical "1", the first amplifier branch 16 is configured to close the discharge path 34 if the test logical input TI is a logical "1." This is because the transistor M13 is activated in response to the test enable input TE being a logical "1," and the transistor M14 is activated in response to the test logical input TI being a logical "1." If the test logical input TI is logical "1," the inverted test logical input TI' is a logical "0." Accordingly, the second amplifier branch 18 is configured to maintain the discharge path 36 open. This is because the transistor M17 configured to be deactivated by the inverted test logical input TI' is a logical "0," and thus the test logical input TI is a logical "1."

During the scan mode, the non-inverted clock signal CLK is maintained low at logic "0" while the inverted clock signal is maintained high at logic "1." To test a stream of test bits with the TLE 10 shown in FIG. 2, the test enable input TE is used for synchronization. This allows for chains of TLEs, each of which may be like the TLE 10 shown in FIG. 2 to be connected to provide a scan chain mechanism. A global test input may be provided at an entry point of the TLEs in the scan chain mechanism to set a logical state of the test logical input TI. As explained in further detail below, the test enable input TE is utilized for synchronization, and thus both a logical state of the global test input and the test logical input TI can be set by one of the test bits during each scan cycle. Scan cycles can be repeated for each of the test bits and thereby provide testing for the stream of test bits.

Referring again to the TLE 10 shown in FIG. 2, a scan cycle begins when the non-inverted clock signal CLK and the test enable input TE are both provided at logical "0" (and thus the inverted clock signal CLK' being provided at a logical "1). A logical state of the test logical input TI and a logical state of the inverted logical input TI' may then be set as a result of a logical state of the global test input. Next, a logical state of the test enable input TE is set to a logic "1," which indicates the scan mode. The clock signal remains in the logical state "0," and thus the inverted clock signal CLK' remains in the logical state "1."

In the scan mode and while the test enable input TE is provided at logical "1", the second amplifier branch 18 is configured to close the discharge path 36 if the test logical input TI is a logical "0." If the test logical input TI is logical "0," the inverted test logical input TI' is a logical "1." As such, the transistor M16 is activated in response to the test enable input TE being a logical "1," and the transistor M17 is activated in response to the inverted test logical input TI' being a logical "1." The first amplifier branch 16 is configured to maintain the discharge path 34 open. This is because the transistor M14 is configured to be deactivated by the test logical input TI being a logical "0." Furthermore, the first amplifier branch 16 disables the first input gate network 12 from charging the isolated control node 22 while the second amplifier branch 18 disables the second input gate network 14 from discharging the isolated control node 24. This is because the transistor M15 and the transistor M18 are both deactivated in response to the test enable input TE being provided at logic "1." Therefore, whether the output node 26 discharges during the scan mode depends on whether the discharge path 34 is closed or is maintained open, which is determined by the test logical input TI. Furthermore, whether the output node 28 discharges during the scan mode depends on whether the discharge path 36 is closed or is maintained open, which is determined by the test logical input TI.

As such, the logical output N1 is provided to be a logical "0" by the first amplifier branch 16, and the logical output N2 is provided by the second amplifier branch 18 as a logical "1" during the scan mode when the test logical input TI is provided at a logical "1." Thus, the differential logical output DLO is provided to the sequential state element 20 as differential logic "0/1." The sequential state element 20 thus generates the logical output Q as a logical "1" and the inverted logical output Q' as a logical "0." Additionally, the logical output N1 is provided to be a logical "1" by the first amplifier branch 16, and the logical output N2 is provided by the second amplifier branch 18 as a logical "0" during the scan mode when the test logical input TI is provided at a logical "0." Thus, the differential logical output DLO is provided to the sequential state element 20 as differential logic "1/0." The sequential state element 20 thus generates the logical output Q as a logical "0" and the inverted logical output Q' as a logical "1." The test logical input TI can now be provided again at a logical "0." If there are more test bits in the stream, the global test input can set in accordance with the next test bit, and the scan cycle can be repeated until all the test bits in the stream have been scanned.

Figure 3:
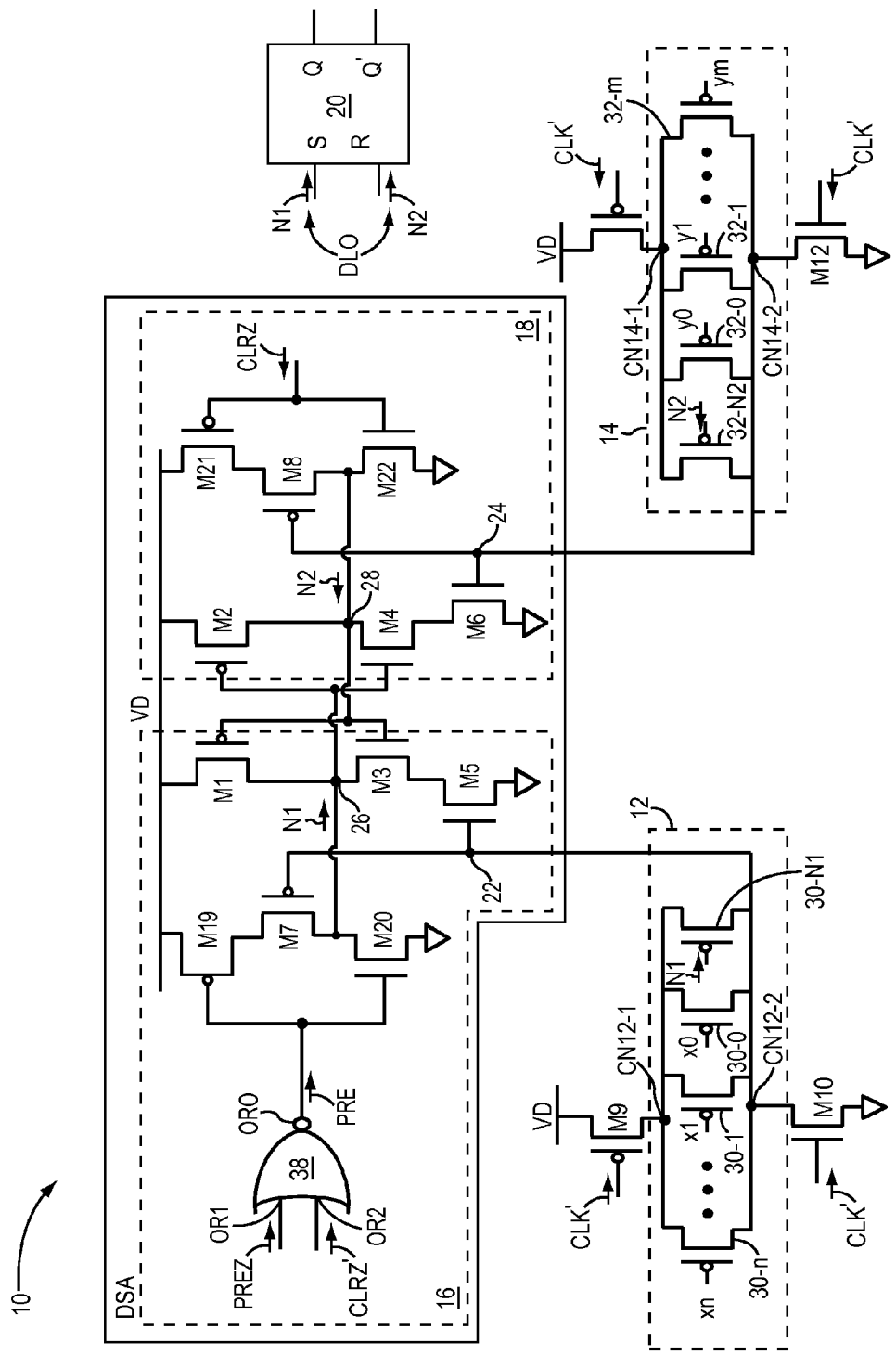
FIG. 3 illustrates yet embodiment of the threshold logic element with an embodiment of the differential sense amplifier that provides preset and clear functionality.

FIG. 3 illustrates yet another embodiment of the TLE 10. The TLE 10 includes the same embodiments of the first input gate network 12, the second input gate network 14, and the sequential state element 20 described above in FIG. 1.

However, the TLE 10 includes yet another embodiment of the differential sense amplifier DSA. The differential sense amplifier DSA shown in FIG. 3 is similar to the differential sense amplifier DSA shown in FIG. 1. More specifically, the differential sense amplifier DSA shown in FIG. 3 includes another embodiment of the first amplifier branch 16 (i.e., the first NAND gate) having the transistors M1, M3, M5, M7, the isolated control node 22, and the output node 26, which all operate in the same manner described above with respect to FIG. 1 during the reset state and the evaluation state. Furthermore, the differential sense amplifier DSA shown in FIG. 3 includes another embodiment of the second amplifier branch 18 (i.e., the second NAND gate) having the transistors M2, M4, M6, M8, the isolated control node 24, and the output node 28, which all operate in the same manner described above with respect to FIG. 1 during the reset state and the evaluation state. However, in this embodiment, the differential sense amplifier DSA shown in FIG. 3 is configured to provide asynchronous preset and clear functionality so that the differential logic output DLO can be set to a known differential logical state independently of the non-inverted clock signal CLK and inverted clock signal CLK' when the TLE 10 is provided in an IC.

To provide asynchronous preset and clear functionality, the first amplifier branch 16 shown in FIG. 3 further includes a NOR gate 38, a transistor M19, and a transistor M20; while the second amplifier branch 18 further includes a transistor M21 and a transistor M22. With respect to the second amplifier branch 18, the transistor M21 is a PFET, and the transistor M22 is an NFET. In the second amplifier branch 18, a gate of the transistor M21 and a gate of the transistor M22 each receive a clear input CLRZ. A source of the transistor M21 is configured to receive the supply voltage VD, and a drain of the transistor M21 is coupled to the source of the transistor M8. A drain of the transistor M22 is coupled to the drain of the transistor M8 and to the output node 28. A source of the transistor M22 is coupled to ground.

With respect to the first amplifier branch 16, the transistor M19 is a PFET, and the transistor M20 is an NFET. The NOR gate 38 includes an input terminal OR1 configured to receive a preset input PREZ and an input terminal OR2 configured to receive an inverted clear input CLRZ'. The inverted clear input CLRZ' is inverted with respect to the clear input CLRZ. The NOR gate 38 has an output terminal ORO. Furthermore, the NOR gate 38 is configured to generate a preset output PRE from the output terminal ORO in accordance with the preset input PREZ and the inverted clear input CLRZ'. More specifically, the NOR gate 38 performs a NOR logic operation on the preset input PREZ and the inverted clear input CLRZ' to generate the preset output PRE.

The output terminal ORO of the NOR gate 38 is coupled to a gate of the transistor M19 and a gate of the transistor M20. Thus, in the first amplifier branch 16, the gate of the transistor M19 and the gate of the transistor M20 each receive the preset output PRE from the NOR gate. A source of the transistor M19 is configured to receive the supply voltage VD, and a drain of the transistor M19 is coupled to the source of the transistor M7. A drain of the transistor M20 is coupled to the drain of the transistor M7 and to the output node 26. A source of the transistor M20 is coupled to ground.

During a normal operating mode, the preset input PREZ is provided at logic "0," and the clear input CLRZ is provided at logic "0." Thus, the inverted clear input CLRZ' is provided at logic "1." Thus while the TLE 10 shown in FIG. 3 is operating in the normal operating mode, the TLE 10 shown in FIG. 3 operates in the same manner as the TLE 10 shown in FIG. 1 during both the reset state and the evaluation state in accordance with the non-inverted clock signal CLK and the inverted clock signal CLK'. More specifically, when the clear input CLRZ is at logic "0," the transistor M21 is activated and the transistor M22 is deactivated in the second amplifier branch 18. Additionally, when the preset input PREZ is provided at logic "0" and the clear input CLRZ is provided at logic "0" (and thus the inverted clear input CLRZ' is at logic "1"), the NOR gate 38 generates the preset output PRE at logic "0." Thus, the transistor M19 is activated and the transistor M20 is deactivated in the first amplifier branch 16. Accordingly, the TLE 10 shown in FIG. 3 operates as described above with respect to FIG. 1 during the reset state and the evaluation state and is synchronized in accordance with the non-inverted clock signal CLK and the inverted clock signal CLK'.

However, the differential sense amplifier DSA is configured to force the differential logical output DLO to a differential logical state of "0/1" during a preset mode irrespective of the non-inverted clock signal CLK and the inverted clock signal CLK'. Accordingly, the logical output N1 generated by the first amplifier branch 16 and the logical output N2 generated by the second amplifier branch 18 are forced to a logic "1" irrespective to the non-inverted clock signal CLK. Thus, the sequential state element 20 generates the logical output Q at a logic "1" and the inverted logical output Q' at a logic "0." More specifically, during a preset mode, the preset input PREZ is provided at logic "1" and the clear input CLRZ is provided at logic "0." Thus, the inverted clear input CLRZ' is provided at logic "1." As such, when the clear input CLRZ is at logic "0," the transistor M21 is activated, and the transistor M22 is deactivated in the second amplifier branch 18. However, when the preset input PREZ is provided at logic "1" and the inverted clear input CLRZ is provided at logic "0" (and thus the inverted clear input CLRZ' is at logic "1"), the NOR gate 38 generates the preset output PRE at logic "1." This causes the transistor M19 to be deactivated and the transistor M20 to be activated. As such, the transistor M20 pulls the output node 26 of the first amplifier branch 16 nearly to ground. The first amplifier branch 16 is thus forced to generate the logical output N1 at logical "0" regardless of the non-inverted clock signal CLK and the inverted clock signal CLK'. However, the transistor M21 in the second amplifier branch 18 is activated, and thus the transistor M8 has a closed path to the supply voltage VD. Furthermore, the transistor M2 is activated by the logical output N1 at logical "0," and thus the output node N2 is pulled toward the DC voltage magnitude of the supply voltage VD. As such, the second amplifier branch is forced to generate the logical output N2 at logical "1" regardless of the non-inverted clock signal CLK and the inverted clock signal CLK'.

Likewise, the differential sense amplifier DSA is configured to force the differential logical output DLO to a differential logical state of "1/0" during a clear mode irrespective of the non-inverted clock signal CLK and the inverted clock signal CLK'. Accordingly, the logical output N1 generated by the first amplifier branch 16 is forced to a logic "1," and the logical output N2 generated by the second amplifier branch 18 is forced to a logic "0" irrespective to the non-inverted clock signal CLK. Thus, the sequential state element 20 generates the logical output Q at a logic "0" and the inverted logical output Q' at a logic "1." More specifically, during a clear mode, the preset input PREZ is provided at logic "0," and the clear input CLRZ is provided at logic "1." Thus, the inverted clear input CLRZ' is provided at logic "0." When the clear input CLRZ is at logic "1," the transistor M21 is deactivated, and the transistor M22 is activated in the second amplifier branch 18. As such, the transistor M22 pulls the output node 28 of the second amplifier branch 18 nearly to ground. The second amplifier branch 18 is thus forced to generate the logical output N2 at logical "0" regardless of the non-inverted clock signal CLK and the inverted clock signal CLK'. However, when the preset input PREZ is provided at logic "0" and the inverted clear input CLRZ is provided at logic "1" (and thus the inverted clear input CLRZ' is at logic "0"), the NOR gate 38 generates the preset output PRE at logic "0." This causes the transistor M19 to be activated and the transistor M20 to be deactivated. Since the transistor M19 in the first amplifier branch 16 is activated, the transistor M7 has a closed path to the supply voltage VD. Furthermore, the transistor M1 is activated by the logical output N2 at logical "0," and thus the output node N1 is pulled toward the DC voltage magnitude of the supply voltage VD. As a result, the first amplifier branch 16 is forced to generate the logical output N1 at logical "1" regardless of the non-inverted clock signal CLK and the inverted clock signal CLK'.

Figure 4:
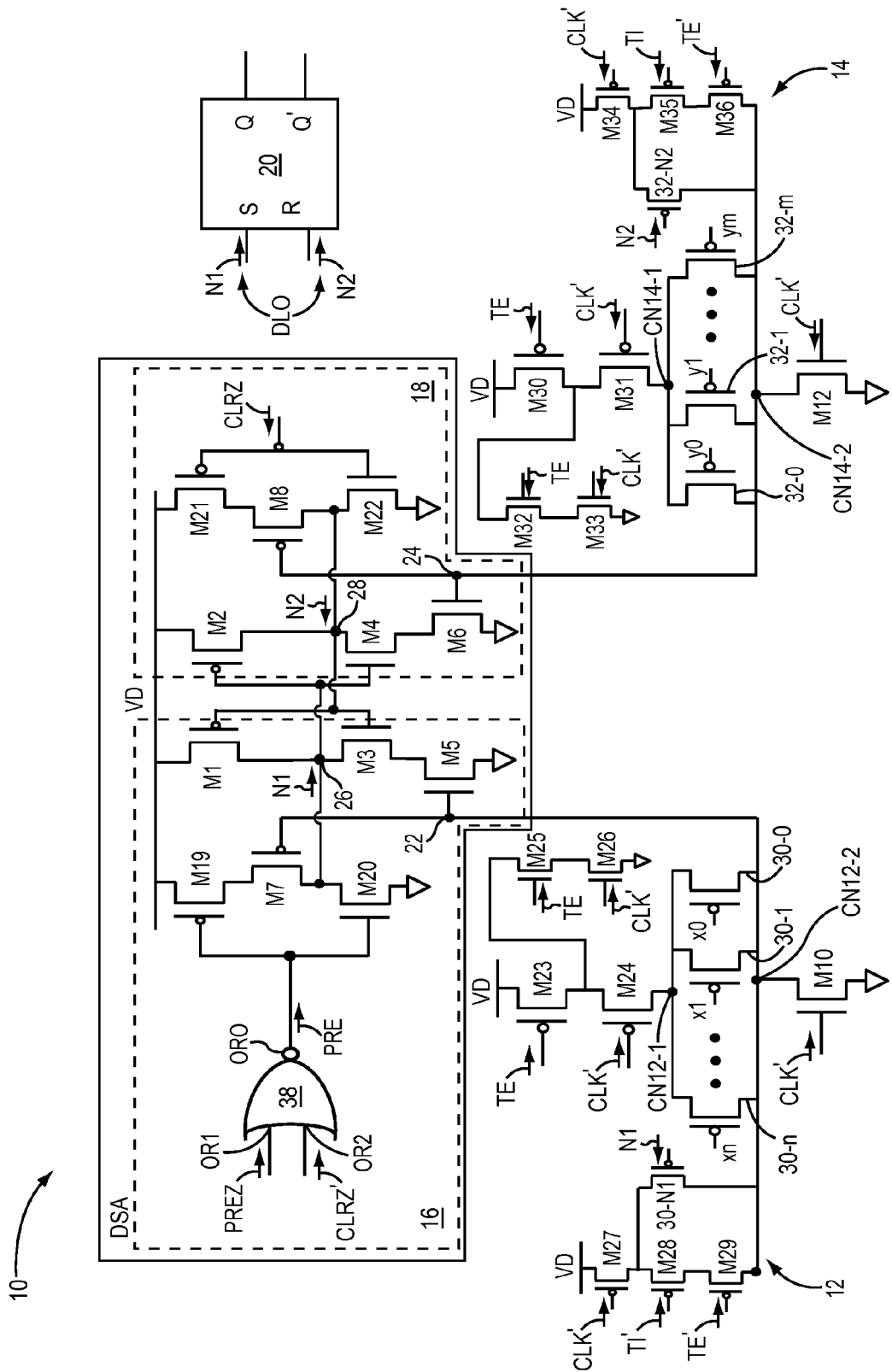
FIG. 4 is still another embodiment of the threshold logic element having the same embodiment of the differential sense amplifier shown in FIG. 3 and with embodiments of the first input gate network and the second input gate network configured to provide scan mode functionality.

FIG. 4 illustrates still another embodiment of the TLE 10. The TLE 10 includes the same embodiment of the differential sense amplifier DSA described above with respect to FIG. 3 and the same embodiment of the sequential state element 20 described above with respect to FIG. 1. The differential sense amplifier DSA thus allows the TLE 10 shown in FIG. 4 to operate in a normal operational mode, a preset mode, and a clear mode as described above with respect to FIG. 3.

The TLE 10 shown in FIG. 4 also includes another embodiment of the first input gate network 12 and another embodiment of the second input gate network 14. The first input gate network 12 shown in FIG. 4 includes the transmission gates 30-0 through 30-n, which are described above with respect to FIG. 1. The transmission gates 30-0 through 30-n receive one of the logical inputs x as described above. The transistor M10 is provided at the common node CN12-2 and is configured to receive the inverted clock signal CLK', as described above with respect to FIG. 1. Likewise, the second input gate network 14 shown in FIG. 4 includes the transmission gates 32-0 through 32-m, which are described above with respect to FIG. 1. The transmission gates 32-0 through 32-m receive one of the logical inputs y as described above. The transistor M12 is provided at the common node CN14-2 and is configured to receive the inverted clock signal CLK', as described above with respect to FIG. 1.

However, in the TLE 10 shown in FIG. 4, the first input gate network 12 and the second input gate network 14 shown in FIG. 4 are configured to provide scan functionality to the TLE 10. More specifically, the first input gate network 12 includes transistors M23 through M29 while the second input gate network 1414 includes transistors M30 through M36.

With respect to the first input gate network 12, the transistors M23, M24, M27, M28, and M29 are each provided as a PFET while the transistors M25 and M26 are each provided as an NFET. A source of the transistor M23 is configured to receive the supply voltage VD. A drain of the transistor M23 is coupled to a source of the transistor M24. A gate of the transistor M23 is configured to receive the test enable input TE. A drain of the transistor M24 is coupled to the common connection node CN12-1. A gate of the transistor M24 is configured to receive the inverted clock signal CLK'. A drain of the transistor M25 is coupled to the drain of the transistor M23 and the source of the transistor M24. A source of the transistor M25 is coupled to a drain of the transistor M26. A gate of the transistor M25 is configured to receive the test enable input TE. A source of the transistor M26 is coupled to ground. A gate of the transistor M26 is configured to receive the inverted clock signal CLK'. Furthermore, a source of the transistor M27 is configured to receive the supply voltage VD. A drain of the transistor M27 is coupled to a drain of the transistor M28. A gate of the transistor M27 is configured to receive the inverted clock signal CLK'. A drain of the transistor M28 is coupled to a drain of the transistor M29. A gate of the transistor M28 is configured to receive the inverted test input TI'. A drain of the transistor M29 is coupled to the common node CN12-2 and thus the isolated control node 22. A gate of the transistor M29 is configured to receive an inverted test enable input TE', which is inverted with respect to the test enable input TE.

Also, in this embodiment, the transmission gate 30-N1 is coupled differently in this embodiment than in the embodiment described above with respect to FIG. 1. As in the embodiment shown in FIG. 1, the gate of the transmission gate 30-N1 is configured to receive the logical output N1 as feedback from the output node 26 of the first amplifier branch 16. Furthermore, the drain of the transmission gate 30-N1 is coupled to the common connection node CN12-2. However, in this embodiment, the source of the transmission gate 30-N1 is coupled to the drain of the transistor M27 and the source of the transistor M28.

With respect to the second input gate network 14, the transistors M30, M31, M34, M35, and M36 are each provided as a PFET while the transistors M32 and M33 are each provided as an NFET. A source of the transistor M30 is configured to receive the supply voltage VD. A drain of the transistor M30 is coupled to a source of the transistor M31. A gate of the transistor M30 is configured to receive the test enable input TE. A drain of the transistor M31 is coupled to the common connection node CN14-1. A gate of the transistor M31 is configured to receive the inverted clock signal CLK'. A drain of the transistor M32 is coupled to the drain of the transistor M30 and the source of the transistor M31. A source of the transistor M32 is coupled to a drain of the transistor M33. A gate of the transistor M32 is configured to receive the test enable input TE. A source of the transistor M33 is coupled to ground. A gate of the transistor M33 is configured to receive the inverted clock signal CLK'. Furthermore, a source of the transistor M34 is configured to receive the supply voltage VD. A drain of the transistor M34 is coupled to a drain of the transistor M35. A gate of the transistor M34 is configured to receive the inverted clock signal CLK'. A drain of the transistor M35 is coupled to a drain of the transistor M36. A gate of the transistor M35 is configured to receive the test input TI. A drain of the transistor M36 is coupled to the common node CN14-2 and thus the isolated control node 24. A gate of the transistor M36 is configured to receive an inverted test enable input TE', which is inverted with respect to the test enable input TE.

Also, in this embodiment, the transmission gate 32-N2 is coupled differently in this embodiment than in the embodiment described above with respect to FIG. 1. As in the embodiment shown in FIG. 1, the gate of the transmission gate 32-N2 is configured to receive the logical output N2 as feedback from the output node 28 of the first amplifier branch 16. Furthermore, the drain of the transmission gate 32-N2 is coupled to the common connection node CN14-2. However, in this embodiment, the source of the transmission gate 32-N2 is coupled to the drain of the transistor M34 and the source of the transistor M35.

During a normal operating mode, the test enable input TE and the test logical input TI are each provided at logic "0." Also, during the normal operating mode, the inverted test logical input TI' and the inverted test enable input TE' are each provided at logic "1." Thus while the TLE 10 shown in FIG. 4 is operating in the normal mode, the TLE 10 shown in FIG. 4 operates in the same manner as the TLE 10 shown in FIG. 1 during both the reset state and the evaluation state in accordance with the non-inverted clock signal CLK and the inverted clock signal CLK'. As such, in the normal operating mode, the transmission gates 30 and the transmission gates 32 are deactivated while the inverted clock signal CLK' is at logic "0" and are allowed to be activated while the inverted clock signal CLK' is at logic "1." When the inverted clock signal CLK' is at logic "0" during the normal operational mode, the transistors M25, M26, M27, M28, M29 are inactive in the first input gate network 12, and the transistors M32, M33, M34, M35, M36 are inactive in the second input gate network 14. Furthermore, the transistors M23, M24 are active in the first input gate network 12, and the transistors M30, M31, are active in the second input gate network 14. Thus, the transistors M23, M24 pull the common node CN12-1 up to the supply voltage VD, and the transistors M30, M31 pull the common node CN14-1 up to the supply voltage VD.

When the inverted clock signal CLK' is at logic "1" during the normal operational mode, the transistors M23, M24, M25, M26, M28, M29 are inactive in the first input gate network 12, and the transistors M30, M31, M32, M33, M35, M36 are inactive in the second input gate network 14. Furthermore, the transistor M27 is active in the first input gate network 12, and the transistor M34 is active in the second input gate network 14. The transistors M10 and M12 are active. Thus, the common node CN12-1 is pulled up near the supply voltage or down near ground by the transmission gate 30-N1 depending on the logical output N1 fed back to the transmission gate 30-N1. Furthermore, the common node CN14-1 is pulled up near the supply voltage or down near ground by the transmission gate 32-N2 depending on the logical output N2 fed back to the transmission gate 32-N2. The logical output N1 and the logical output N2 will be provided in a logical state depending on whether the first amplifier branch 16 or the second amplifier branch 18 wins the current race, as described above with respect to FIG. 1.

In the scan mode and while the test enable input TE is provided at logical "1" (and thus the inverted test enable input TE' is provided at logical "0"), the common nodes CN12-1, CN12-2, CN14-1, CN14-2 are each pulled near ground when the non-inverted clock signal CLK is a logic "0," and the inverted clock signal CLK' is a logic 1. More specifically, the transistors M25, M26 are activated and thus close a discharge path to ground to provide the common node CN12-1 near ground. The transistor M10 is activated and thereby pulls the common node CN12-2 near ground. The transmission gates 30 are thus deactivated. Furthermore, the isolated control node 22 is pulled near ground and at logic "0." Accordingly, the transistor M7 is activated and pulls the output node 26 high so as to provide the logical output N1 at logic "1." Likewise, the transistors M32, M33 are activated and thus close a discharge path to ground to provide the common node CN14-1 near ground. The transistor M12 is activated and thereby pulls the common node CN14-2 near ground. The transmission gates 32 are thus deactivated. Furthermore, the isolated control node 24 is pulled near ground and at logic "0." Accordingly, the transistor M8 is activated and pulls the output node 28 high so as to provide the logical output N2 at logic "1." Since the transistor M27 is deactivated and the transistor M34 is deactivated, the transmission gate 30-N1 and the transmission gate 32-N2 are deactivated.

During the scan mode and while the test enable input TE is provided at logical "1" (and thus the inverted test enable input TE' is provided at logical "0"), the differential logical output DLO is forced to a known differential logical state based on a logical state of the test logical input TI and the inverted test logical input TI' when the non-inverted clock signal CLK is at logic "1" and the inverted clock signal CLK' is at logical "0." More specifically, either the common node CN12-2 is pulled high by the transistors M27, M28, M29, or the common node CN14-2 is pulled high by the transistors M34, M35, M36 depending on the logical state of the test logical input TI and the inverted logical input TI'.

For example, if the test logical input TI is logical "0" and the inverted test logical input TI' is a logical "1," the transistors M27, M28, M29 remain deactivated while the transistors M34, M35, M36 are activated so that the common node CN14-2 (and thus the isolated control node 24) is pulled up near the DC supply magnitude of the supply voltage VD (i.e., pulled high) and thus to a logical "1." As a result, the output node 28 is discharged, which results in the logical output N2 being provided at logic "0." Thus, the logical output N2 is provided at logic "0" in response to the test logical input TI being provided at logic "0" during the scan mode. The logical output N1 is maintained at logic "1" since the isolated control node 22 is set to logic "0" and thus the output node 26 is not discharged. The differential logic output DLO thus has a differential logical state of "1/0." Note that the transmission gate 30-N1 is deactivated since the logical output N1 is maintained at logic "1," while the transmission gate 32-N2 is deactivated since the transistors M35, M36 are activated. Thus, feedback from the differential sense amplifier DSA is deactivated during the scan mode.

Likewise if the test logical input TI is logical "1" (and the inverted logical output is provided at logic "0") during the scan mode and while the non-inverted clock signal CLK is at logic "1" (and thus the inverted clock signal CLK' is provided at logic "0"), the transistors M34, M35, M36 remain deactivated while the transistors M27, M28, M29 are activated so that the common node CN12-2 (and thus the isolated control node 22) is pulled up near the DC supply magnitude of the supply voltage VD (i.e., pulled high) and thus to a logical "1." As a result, the output node 28 is discharged, which results in the logical output N2 being provided at logic "0." Thus, the logical output N1 is provided at logic "0" in response to the test logical input TI being provided at logic "1" during the scan mode. The logical output N2 is maintained at logic "1" since the isolated control node 24 is set to logic "0" and thus the output node 28 is not discharged The differential logic output DLO thus has a differential logical state of "0/1." Note that the transmission gate 32-N2 is deactivated since the logical output N2 is maintained at logic "1," while the transmission gate 30-N1 is deactivated since the transistors M28, M29 are activated. Thus, feedback from the differential sense amplifier DSA is deactivated during the scan mode.

Figure 5:
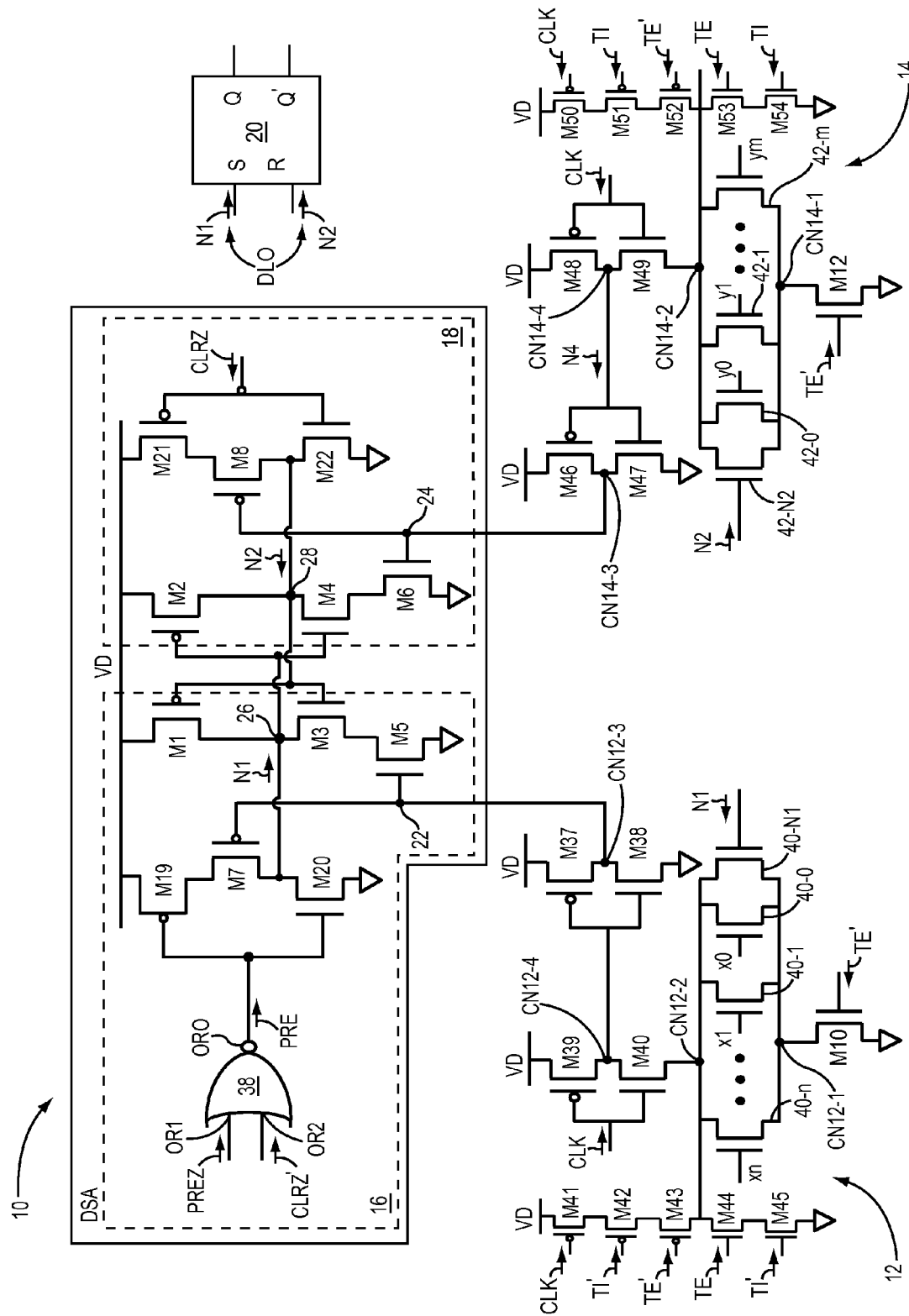
FIG. 5 illustrates still yet another embodiment of the threshold logic element having the same embodiment of the differential sense amplifier shown in FIG. 3 and with an embodiment of the first input gate network formed from parallel N-channel field effect transistors (N-FETs) and an embodiment of the second input gate network also formed from parallel N-FETs.

FIG. 5 illustrates still another embodiment of the TLE 10. The TLE 10 includes the same embodiment of the differential sense amplifier DSA described above with respect to FIG. 3 and the same embodiment of the sequential state element 20 described above with respect to FIG. 1. The differential sense amplifier DSA thus allows the TLE 10 shown in FIG. 5 to operate in a normal operational mode, a preset mode, and a clear mode as described above with respect to FIG. 3.

The TLE 10 shown in FIG. 5 also includes another embodiment of the first input gate network 12 and another embodiment of the second input gate network 14. In the illustrated embodiment, the first input gate network 12 is formed by a number of transmission gates 40-0 through 40-$n$ and 40-N1 (referred to generically as elements "40") connected in parallel branches of the first input gate network 12. The first input gate network 12 shown in FIG. 5 includes the transmission gates 40-0 through 40-$n$ The transmission gates 40-0 through 40-$n$ receive a different corresponding one of the logical inputs x-0 through xn. The transistor M10 is provided at the common node CN12-1. The gate of the transistor M10 is configured to receive the inverted test enable input TE', the drain of the transistor M10 is coupled to the common node CN12-1, and the source of the transistor M10 is coupled to ground. In this embodiment, each of the transmission gates 40 is an NFET (such as an NMOS) and has a source coupled to the common node CN12-1 and thus the drain of the transistor M10. Furthermore, each of the transmission gates 40 has a drain coupled to the common node CN12-2. The common node CN12-2 is operably associated with the isolated control node 22 of the first amplifier branch 16, as explained in further detail below. The transmission gate 40-N1 has a gate configured to receive the logical output N1 from the first amplifier branch 16. In this manner, the transmission gate 40-N1 is driven by feedback from the differential sense amplifier DSA.

Likewise, the second input gate network 14 shown in FIG. 5 includes the transmission gates 42-0 through 42-$m$, The transmission gates 42-0 through 42-$m$ receive a different corresponding one of the logical inputs y-0 through ym. The transistor M12 is provided at the common node CN14-1. The gate of the transistor M12 is configured to receive the inverted test enable input TE', the drain of the transistor M12 is coupled to the common node CN14-1, and the source of the transistor M12 is coupled to ground. In this embodiment, each of the transmission gates 42 is an NFET (such as an NMOS) and has a source coupled to the common node CN14-1 and thus the drain of the transistor M12. Furthermore, each of the transmission gates 42 has a drain coupled to the common node CN14-2. The common node CN14-2 is operably associated with the isolated control node 24 of the second amplifier branch 18, as explained in further detail below. The transmission gate 42-N2 has a gate configured to receive the logical output N2 from the second amplifier branch 18. In this manner, the transmission gate 42-N2 is driven by feedback from the differential sense amplifier DSA.

The TLE 10 shown in FIG. 5, the first input gate network 12 and the second input gate network 14 shown in FIG. 5 are configured to provide scan functionality to the TLE 10. The first input gate network 12 includes transistors M37 through M45, while the second input gate network 14 includes transistors M46 through M54. With respect to the first input gate network 12, the transistors M37, M39, M41, M42, and M43 are each provided as a PFET while the transistors M38, M40, M44, and M45 are each provided as an NFET. A source of the transistor M37 is configured to receive the supply voltage VD. A drain of the transistor M37 is coupled to a drain of the transistor M38 at a common node CN12-3. A source of the transistor M38 is coupled to ground. In this manner, the transistor M37 and the transistor M38 form a push-pull transistor pair. The common node CN12-3 is coupled to the isolated control node 22 of the first amplifier branch 16.

A gate of the transistor M37, a gate of the transistor M38, a drain of the transistor M39, and a drain of the transistor M40 are each coupled at a common node CN12-4. A source of the transistor M39 is coupled to receive the supply voltage VD while a source of the transistor M40 is coupled to the common node CN-12-2. A gate of the transistor M39 and a gate of the transistor M40 are each coupled to receive the non-inverted clock signal CLK. The transistor M39 and the transistor M40 thus also form another push-pull transistor pair.

The transistors M41-M43 are stacked and coupled between the supply voltage VD and the common node CN12-2 and the transistors M44, M45 are stacked and between the common node CN12-2 and ground. More specifically, a source of the transistor M41 is configured to receive the supply voltage VD. A drain of the transistor M41 is coupled to a source of the transistor M42. A drain of the transistor M42 is coupled to a source of the transistor M43. A drain of the transistor M43 is coupled to the common node CN12-2. Furthermore, a drain of the transistor M44 is coupled to the common node CN12-2 and the drain of the transistor M45. A source of the transistor M45 is coupled to ground. Additionally, a gate of the transistor M41 is configured to receive the non-inverted clock signal CLK. A gate of the transistor M42 and a gate of the transistor M45 are each configured to receive the inverted test input TI'. Finally, a gate of the transistor M43 is configured to receive the inverted test enable input TE' while a gate of the transistor M44 is configured to receive the test enable input TE.

With respect to the second input gate network 14, the transistors M46, M48, M50, M51, and M52 are each provided as a PFET while the transistors M47, M49, M53, and M54 are each provided as an NFET. A source of the transistor M46 is configured to receive the supply voltage VD. A drain of the transistor M46 is coupled to a drain of the transistor M47 at a common node CN14-3. A source of the transistor M47 is coupled to the common node CN14-2. In this manner, the transistor M46 and the transistor M47 form a push-pull transistor pair. The common node CN14-3 is coupled to the isolated control node 24 of the second amplifier branch 18.

A gate of the transistor M46, a gate of the transistor M47, a drain of the transistor M48, and a drain of the transistor M49 are each coupled at a common node CN14-4. A source of the transistor M48 is coupled to receive the supply voltage VD while a source of the transistor M49 is coupled to the common node CN-14-2. A gate of the transistor M48 and a gate of the transistor M49 are each coupled to receive the non-inverted clock signal CLK. The transistor M48 and the transistor M49 thus also form another push-pull transistor pair.

The transistors M50-M52 are stacked and coupled between the supply voltage VD and the common node CN14-2 and the transistors M53, M54 are stacked and between the common node CN14-2 and ground. More specifically, a source of the transistor M50 is configured to receive the supply voltage VD. A drain of the transistor M50 is coupled to a source of the transistor M51. A drain of the transistor M51 is coupled to a source of the transistor M52. A drain of the transistor M52 is coupled to the common node CN14-2. Furthermore, a drain of the transistor M53 is coupled to the common node CN14-2 and the drain of the transistor M54. A source of the transistor M54 is coupled to ground. Additionally, a gate of the transistor M50 is configured to receive the non-inverted clock signal CLK. A gate of the transistor M51 and a gate of the transistor M54 are each configured to receive the test input TI. Finally, a gate of the transistor M52 is configured to receive the inverted test enable input TE' while a gate of the transistor M53 is configured to receive the test enable input TE.

During the normal operating mode, the test enable input TE and the test logical input TI are each provided at logical "0" and therefore the inverted test enable input TE' and the test logical input TI' are each provided at logical "1." As a result, the transistors M41-M45 and M50-M54 are all deactivated. In order to enter the reset state, the non-inverted clock signal CLK is set to a voltage level corresponding to a logic "1." The transistor M10 pulls the common node CN12-1 towards ground, while the transistor M12 pulls the common node CN14-1 towards ground. Since the non-inverted clock signal CLK is provided at a logic "1" during the reset state, the transistors M39, M48 are therefore activated, and the transistors M40, M49 are therefore deactivated. As such, the common nodes CN12-4, CN14-4 are each pulled up near the supply voltage VD and at a logic "1." The common nodes CN12-2, CN14-2 thus have no path to the supply voltage VD, and the transmission gates 40, 42 are deactivated. Since the common nodes CN12-4, CN14-4 are pulled up to logic "1," the transistors M37, M46 are therefore deactivated, and the transistors M38, M47 are therefore activated. Thus, the common nodes CN12-4, CN14-3 are each pulled towards ground, and therefore the isolated control nodes 22, 24 are each therefore provided at logic "0." Therefore, the logical output N1 and the logical output N2 are thus each provided at logic "1" during the reset state by the differential sense amplifier DSA, as described above with respect to FIG. 1.

In the evaluation state, the non-inverted clock signal CLK is set to a voltage level corresponding to a logic "0." The transistor M10 is therefore deactivated. The transistors M39, M48 are therefore deactivated. As such, the common nodes CN12-4, CN14-4 are each pulled up down near the ground and at a logic "0." The common nodes CN12-2, CN14-2 have a path to the supply voltage VD and the transmission gates 40, 42 are allowed to be activated depending on the logical inputs x, y, and the logical outputs N1, N2 provided as feedback. Which of the transistors M40, M49 is therefore activated will depend on whether more transmission gates 40, 42 are activated, and thus will determine whether the first amplifier branch 16 or the second amplifier branch 18 wins the current race. Once either the common node CN12-4 or the common node CN14-4 is pulled low, either the transistor M37 or the transistor M46 is activated and either the transistor M38 or the transistor M47 is therefore deactivated. If the number of transmission gates 40 activated in the first input gate network 12 is greater than the number of transmission gates 42 activated in the second input gate network 14, the common nodes CN12-2, CN12-4 are pulled near ground and thus the common node CN12-3 and the isolated control node 22 are pulled high to logic "1." On the other hand, if the number of transmission gates 42 activated in the second input gate network 14 is greater than the number of transmission gates 40 activated in the first input gate network 12, the common nodes CN14-2, CN14-4 are pulled near ground and thus the common node CN14-3 and the isolated control node 24 are pulled high to logic "1." The logical outputs N1, N2 of FIG. 5 are provided by the differential sense amplifier DSA as described above with respect to FIG. 1 depending on the amplifier branch 14,16 that wins the current race. The logical output N1 is fed back to the transmission gate 40-N1, and the logical output N2 is fed back to the transmission gate 42-N2 to maintain the appropriate logical outputs N1,N2 during the evaluation state. The sequential state element 20 operates as described above with respect to FIG. 1.

During the scan mode and while the test enable input TE is provided at logical "1" (and thus the inverted test enable input TE' is provided at logical "0"), the differential logical output DLO is forced to a known differential logical state based on a logical state of the test logical input TI and the inverted test logical input TI'. The non-inverted clock signal CLK is held at logic "0." If the test logical input TI is a logic "0" and the inverted logic input TI' is a logic "1" during the scan mode, the transistors M41-M43, M44, M45, M50-52, M53, M54 are allowed to be activated. For example, if the test logical input TI is logical "0" and the inverted test logical input TI' is a logical "1," the transistors M44-M45, M50-M52 are activated and the transistors M41-M43, M53, and M54 are deactivated.

Consequently, the common node CN12-2 is forced to a logic "0," and the common node CN14-2 is forced to a logic "1." Therefore, the isolated control node 22 is forced to a logic "1," and the isolated control node 24 is forced to a logic "0." As a result, the output node 26 is discharged, which results in the logical output N1 being provided at logic "0." Thus, the logical output N1 is provided at logic "0" in response to the test logical input TI being provided at logic "0" during the scan mode. The logical output N2 is maintained at logic "1." The differential logic output DLO thus has a differential logical state of "0/1."

Likewise if the test logical input TI is logical "1" (and the inverted logical output is provided at logic "0"), the transistors M44, M45, M50-M52 are deactivated and the transistors M41-M43, M53, and M54 are activated. Consequently, the common node CN12-2 is forced to a logic "1" and the common node CN14-2 is forced to a logic "0." Therefore, the isolated control node 22 is forced to a logic "0" and the isolated control node 24 is forced to a logic "1." As a result, the output node 28 is discharged, which results in the logical output N2 being provided at logic "0." Thus, the logical output N2 is provided at logic "0" in response to the test logical input TI being provided at logic "1" during the scan mode. The logical output N1 is maintained at logic "0." The differential logic output DLO thus has a differential logical state of "1/0."

The embodiments of the TLE 10 shown in FIGS. 1-5 may be formed by one or more semiconductor die and provided as an IC or as part of an IC. The semiconductor die(s) may have semiconductor substrates formed from any suitable semiconductor material.

Those skilled in the art will recognize improvements and modifications to the preferred embodiments of the present disclosure. All such improvements and modifications are considered within the scope of the concepts disclosed herein and the claims that follow.

What is claimed is:

1. A threshold logic element comprising:
   a first input gate network configured to receive a first set of logical signals wherein the first input gate network comprises a first plurality of transmission gates and wherein the first plurality of transmission gates are each configured to receive a different corresponding one of the first set of logical signals such that one of the first plurality of transmission gates receives a first logical output as feedback from a differential sense amplifier;
   a second input gate network configured to receive a second set of logical signals wherein the second input gate network comprises a second plurality of transmission gates and wherein the second plurality of transmission gates are each configured to receive a different corresponding one of the second set of logical signals such that one of the second plurality of transmission gates receives a second logical output as feedback from the differential sense amplifier; and the differential sense amplifier operably associated with the first input gate network and the second input gate network such that the differential sense amplifier is configured to generate a differential logical output in accordance with a threshold logic function so that the differential logical output has the first logical output and the second logical output, wherein the differential sense amplifier is configured to feed back the differential logical output to the first input gate network and the second input gate network by being configured to provide the first logical output to the first input gate network as one of the first set of logical signals and to provide the second logical output to the second input gate network as one of the second set of logical signals.

2. The threshold logic element of claim 1 wherein:
the first set of logical signals further includes a first set of logical inputs; and
the second set of logical signals further includes a second set of logical inputs.

3. The threshold logic element of claim 1 wherein the first input gate network further comprises a first transistor, and a second transistor wherein:
the first plurality of transmission gates is coupled in parallel between a first common node and a second common node;
the second common node is coupled to the differential sense amplifier;
the first transistor is configured to receive a clock signal and a supply voltage, wherein the first transistor is coupled to the first common node; and
the second transistor is configured to receive the clock signal, wherein the second transistor is coupled between the second common node and ground.

4. The threshold logic element of claim 3 wherein the second input gate network further comprises a third transistor, and a fourth transistor wherein:
the second plurality of transmission gates is coupled in parallel between a third common node and a fourth common node;
the fourth common node is coupled to the differential sense amplifier;
the third transistor is configured to receive the clock signal and the supply voltage, wherein the third transistor is coupled to the third common node; and
the fourth transistor is configured to receive the clock signal, wherein the fourth transistor is coupled between the fourth common node and ground.

5. The threshold logic element of claim 4 wherein:
each of the first plurality of transmission gates is a P-channel field effect transistor (PFET); and
each of the second plurality of transmission gates is a PFET.

6. The threshold logic element of claim 5, wherein:
the first transistor is a PFET;
the second transistor is a N-channel field effect transistor (NFET);
the third transistor is a PFET; and
the fourth transistor is an NFET.

7. The threshold logic element of claim 1, further comprising a sequential state element configured to receive the differential logical output.

8. The threshold logic element of claim 7, wherein:
the sequential state element is an SR latch having a set terminal configured to receive the first logical output and a reset terminal configured to receive the second logical output.

9. The threshold logic element of claim 1 wherein the differential sense amplifier is operable to receive a test logical input and a scan enable input wherein the differential sense amplifier is configured to set the differential logical output in accordance with the test logical input when the scan enable input indicates a scan mode and a clock signal is held in a first logical state.

10. The threshold logic element of claim 9 further comprising a sequential state element configured to receive the differential logical output and generate a logical output based on the differential logical output.

11. The threshold logic element of claim 1 wherein the differential sense amplifier is operable in a preset mode and in a clear mode, wherein the differential sense amplifier is configured to force the differential logical output to a first differential logical state in the preset mode and to force the differential logical output to a second differential logical state in the clear mode.

12. The threshold logic element of claim 1 wherein the first input gate network and the second input gate network are each operable in a scan mode.

13. The threshold logic element of claim 12 further comprising a sequential state element configured to receive the differential logical output and generate a logical output based on the differential logical output.

14. The threshold logic element of claim 1 wherein:
the first plurality of transmission gates are each an N-channel field effect transistor (NFET) and each of the first plurality of transmission gates is configured to receive a different corresponding one of the first set of logical signals; and
the second input gate network comprises a second plurality of transmission gates, wherein the second plurality of transmission gates are each an NFET and each of the second plurality of transmission gates is configured to receive a different corresponding one of the second set of logical signals.

15. The threshold logic element of claim 14 wherein:
each of the first plurality of transmission gates is coupled between a first common node and a second common node; and
each of the second plurality of transmission gates is coupled between a third common node and a fourth common node.

16. The threshold logic element of claim 15 comprising:
a first push pull pair of transistors coupled to one another at a fifth common node, wherein the first push pull pair of transistors is coupled to the second common node and are configured to receive a clock signal; and
a second push pull pair of transistors coupled to one another at a sixth common node, wherein the second push pull pair of transistors are coupled to the fifth common node and the sixth common node is coupled to the differential sense amplifier.

17. The threshold logic element of claim 16 comprising:
a third push pull pair of transistors coupled to one another at a seventh common node, wherein the third push pull pair of transistors is coupled to the second common node and are configured to receive the clock signal; and
a fourth push pull pair of transistors coupled to one another at an eighth common node, wherein the second push pull pair of transistors are coupled to the seventh common node and the eighth common node is coupled to the differential sense amplifier.

18. The threshold logic element of claim 14 wherein the first input gate network and the second input gate network are each operable in a scan mode.

\* \* \* \* \*